(12) United States Patent
Takahashi et al.

(10) Patent No.: US 8,907,674 B2
(45) Date of Patent: Dec. 9, 2014

(54) SYSTEM AND METHOD FOR DETERMINING DEGRADATION OF RECHARGEABLE LITHIUM ION BATTERY

(75) Inventors: Kenji Takahashi, Toyota (JP); Shuji Tomura, Nagoya (JP); Nobuyasu Haga, Seto (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 127 days.

(21) Appl. No.: 13/700,604

(22) PCT Filed: May 19, 2011

(86) PCT No.: PCT/JP2011/061491
§ 371 (c)(1),
(2), (4) Date: Nov. 28, 2012

(87) PCT Pub. No.: WO2011/155298
PCT Pub. Date: Dec. 15, 2011

(65) Prior Publication Data
US 2013/0076363 A1    Mar. 28, 2013

(30) Foreign Application Priority Data

Jun. 7, 2010   (JP) ................... 2010-129999

(51) Int. Cl.
| | |
|---|---|
| G01N 27/416 | (2006.01) |
| G01R 31/36 | (2006.01) |
| H01M 10/54 | (2006.01) |
| H01M 10/48 | (2006.01) |
| H01M 10/42 | (2006.01) |
| H01M 10/0525 | (2010.01) |

(52) U.S. Cl.
CPC ... *G01R 31/3634* (2013.01); *H01M 2010/4292* (2013.01); *Y02E 60/12* (2013.01); *H01M 2220/20* (2013.01); *H01M 10/0525* (2013.01); *H01M 10/54* (2013.01); *Y02T 10/7011* (2013.01); *G01R 31/3679* (2013.01); *H01M 10/48* (2013.01)
USPC .......................................... 324/432; 324/427

(58) Field of Classification Search
USPC ................................................ 324/432, 439
See application file for complete search history.

(56) References Cited

U.S. PATENT DOCUMENTS

| | | |
|---|---|---|
| 2010/0052617 A1 | 3/2010 | Aridome et al. |
| 2010/0153038 A1 | 6/2010 | Tomura et al. |
| 2011/0161025 A1 | 6/2011 | Tomura et al. |
| 2013/0030739 A1 | 1/2013 | Takahashi et al. |

FOREIGN PATENT DOCUMENTS

| | | |
|---|---|---|
| CN | 102834727 A | 12/2012 |
| JP | A-9-232008 | 9/1997 |

(Continued)

*Primary Examiner* — Edward Tso
*Assistant Examiner* — Robert Grant
(74) *Attorney, Agent, or Firm* — Oliff PLC

(57) ABSTRACT

An MPU performs a degradation diagnosis based on an open circuit voltage characteristic of a rechargeable lithium ion battery indicating how the battery varies in open circuit voltage as the battery varies in capacity to obtain a capacity ratio of a positive electrode, a capacity ratio of a negative electrode, and a deviated capacity of the battery. The MPU applies the capacity ratio of the positive electrode and the capacity ratio of the negative electrode to a predetermined map for degradation attributed to wear to estimate a deviated capacity resulting from degradation attributed to wear and separates the deviated capacity into the deviated capacity resulting from degradation attributed to wear and a deviated capacity resulting from deposition of lithium. The MPU uses at least the deviated capacity resulting from deposition of lithium to determine whether a rechargeable lithium ion battery subject to determination of degradation is reusable and/or recyclable.

20 Claims, 17 Drawing Sheets

(56) References Cited

FOREIGN PATENT DOCUMENTS

| JP | A-2003-7348 | 1/2003 |
| JP | A-2008-241246 | 10/2008 |
| JP | A-2009-63555 | 3/2009 |
| JP | A-2009-199936 | 9/2009 |
| JP | A-2010-60384 | 3/2010 |
| JP | A-2010-60408 | 3/2010 |
| JP | A-2010-66232 | 3/2010 |
| JP | A-2011-220917 | 11/2011 |

| DEVIATED CAPACITY ΔQs | NEGATIVE ELECTRODE'S CAPACITY RATIO k2 | |
|---|---|---|
| | 0 · · · · · | 1 |
| POSITIVE ELECTRODE'S CAPACITY RATIO k1   0 : : : : 1 | | |

⇐ DEVIATED CAPACITY (DEGRADATION ATTRIBUTED TO WEAR) ΔQs(W)

|  |  | DETERMINATION OF NEGATIVE ELECTRODE'S REUSABILITY (INCLUDING LITHIUM DEPOSITION) | | |
|---|---|---|---|---|
|  |  | A | B | C |
| DETERMINATION OF POSITIVE ELECTRODE'S REUSABILITY | A | REUSABLE (GRADE I) | REUSABLE (GRADE II) | UNREUSABLE |
|  | B | REUSABLE (GRADE II) | REUSABLE (GRADE II) | UNREUSABLE |
|  | C | UNREUSABLE | ← | ← |

SYSTEM AND METHOD FOR DETERMINING DEGRADATION OF RECHARGEABLE LITHIUM ION BATTERY

TECHNICAL FIELD

The present invention relates to a system and method for determining degradation of a rechargeable lithium ion battery, and more specifically, diagnosing how a rechargeable lithium ion battery is degraded for determining whether the battery is reusable/recyclable.

BACKGROUND ART

In recent years, a rechargeable lithium ion battery is increasingly used as a power supply for driving motors of electric vehicles and hybrid vehicles or a power supply for portable devices.

In particular, when it is applied to an electrically powered vehicle, e.g. an electric vehicle and a hybrid vehicle, it is used in the form of a plurality of packed cells (or a battery pack) in order to ensure required output voltage and a required amount of accumulated electric power, which invites a relatively high battery price. Accordingly, reusing/recycling the battery is an important issue in terms of cost, and diagnosing the battery's degradation to determine whether the battery is reusable/recyclable is an important technique.

For example, Japanese Patent Laying-Open No. 2003-7348 (PTL 1) describes a battery provision system and method characterized by determining whether a used battery is degraded. PTL 1 describes a system in which whether a rechargeable battery is degraded is determined and in accordance therewith if the battery is continuously usable it is recharged and resold by a distributor, otherwise it is sent from the distributor to its manufacturer and thus recycled.

Furthermore, Japanese Patent Laying-Open No. 09-232008 (PTL 2) describes a method of recycling a nonaqueous electrolyte used for various types of batteries including a lithium secondary battery. PTL 2 describes a method in which activated carbon is added to a nonaqueous electrolyte and they are agitated together and then left for a required period of time and thereafter an added liquid is filtered to remove the activated carbon for recovery. This can remove a substance that is a cause of degradation in the added liquid that is adsorbed by the activated carbon to recover the electrolyte from degradation.

As a technique of diagnosing degradation of a rechargeable battery, Japanese Patent Laying-Open No. 2008-241246 (PTL 3) describes a device based on a battery model expression to estimate a state on-line to estimate a state of a rechargeable battery. The document describes that the state estimation device has a characteristics map previously prepared of how a parameter in the battery model expression varies in value from that before use as the battery's state varies, and while the rechargeable battery is in use the device determines a parameter based on the battery model expression and obtains a ratio of the value of the determined parameter to that of the parameter before use corresponding to the battery's current state, (i.e., a rate of change) and diagnoses degradation of the battery.

For a rechargeable lithium ion battery, Japanese Patent Laying-Open No. 2009-63555 (PTL 4) describes whether a rechargeable lithium ion battery mounted in an externally rechargeable vehicle has lithium deposited therein is determined based on reduction of externally electrically charged full charge capacity. PTL 4 further describes that if it is determined that there is deposition of lithium, then, electrically charging/discharging the rechargeable lithium ion battery is restricted in using the battery. Furthermore, Japanese Patent Laying-Open No. 2009-199936 (PTL 5) describes that how many times a lithium secondary battery is electrically charged, how long it is operated, and other similar usage history information are referred to to calculate an amount of lithium deposited in the battery on the negative electrode. PTL 5 further describes starting controlling based on an amount of lithium deposited, as calculated, to dissolve and thus remove dendrite.

CITATION LIST

Patent Literature

PTL 1: Japanese Patent Laying-Open No, 2003-7348
PTL 2: Japanese Patent Laying-Open No. 09-232008
PTL 3: Japanese Patent Laying-Open No. 2008-241246
PTL 4: Japanese Patent Laying-Open No. 2009-63555
PTL 5: Japanese Patent Laying-Open No, 2009-199936

SUMMARY OF INVENTION

Technical Problem

PTLs 1 and 2 do not refer to that in recycling a rechargeable battery, whether the rechargeable battery's degraded state is within a recyclable range is determined before the battery has its cells disassembled. Accordingly, it is not before the cells are disassembled and thereafter chemically analyzed or the like that whether the rechargeable battery has an unrecyclablly degraded state is determined, and the disassembly and chemical analysis may invite a wastefully increased recycling cost.

Furthermore, it is known that degradation of a rechargeable lithium ion battery is significantly affected by deposition of metallic lithium, and accordingly, it is preferable that such should be reflected on determination on degradation for reuse/recycle.

In PTL 3, however, while whether internal resistance increases and whether a diffusion coefficient (or a diffusion resistance) in an active material of positive and negative electrodes is decreased (or increased) can be estimated, the amount of lithium deposited cannot be diagnosed. Furthermore, while PTL 4 describes whether a rechargeable lithium ion battery electrically fully charged periodically by an external power supply has lithium deposited therein is determined as the battery's full charge capacity decreases, the document does not describe a method of quantitatively determining the amount of lithium deposited.

On the other hand, PTL 5 describes using a usage history of a rechargeable lithium ion battery to calculate an amount of lithium deposited therein. However, the usage history used is only the information of how many times the battery is electrically charged, the information of how many times the battery is electrically charged rapidly, the information of how many times the battery is fully electrically charged, and the information of a period of time for which the battery is operated, and the amount of lithium deposited therein is calculated from a regression using these items of information as variables. This is not an estimation based on the battery's actual voltage, current, temperature and the like and thus may not ensure that the amount of lithium deposited is estimated with sufficient precision, and appropriate determination of degradation may not be done.

The present invention has been made to solve such a disadvantage and an object of the present invention is to determine whether a degraded rechargeable lithium ion battery is reusable/recyclable, based on an estimation of an amount of lithium deposited therein, nondestructively without disassembling the battery and appropriately.

Solution to Problem

The present invention in one aspect provides a system for determining degradation of a rechargeable lithium ion battery, including a degradation parameter acquisition unit, a lithium deposition estimation unit and a determination unit. The degradation parameter acquisition unit is configured to perform a degradation diagnosis based on an open circuit voltage characteristic of the rechargeable lithium ion battery indicating how the rechargeable lithium ion battery varies in open circuit voltage as the battery varies in capacity to obtain a capacity ratio of a positive electrode of the rechargeable lithium ion battery, a capacity ratio of a negative electrode of the rechargeable lithium ion battery, and a battery capacity fluctuation amount. The lithium deposition estimation unit is configured to apply the capacity ratios respectively of the positive and negative electrodes that are obtained to a previously obtained correspondence between the capacity ratios respectively of the positive and negative electrodes and a first amount of the battery capacity fluctuation amount to separate the battery capacity fluctuation amount that is obtained into the first amount and a second amount of the battery capacity fluctuation amount the first amount corresponding to degradation attributed to wear, the second amount corresponding to degradation attributed to deposition of lithium. The determination unit is configured to determine whether the rechargeable lithium ion battery is reusable/recyclable based on at least one of: the capacity ratios respectively of the positive and negative electrodes obtained by the degradation parameter acquisition unit; and the second amount calculated by the lithium deposition estimation unit. The capacity ratio of the positive electrode is represented by a ratio of a capacity of the positive electrode with the rechargeable lithium ion battery in a degraded state to a capacity of the positive electrode with the rechargeable lithium, ion battery in an initial state. The capacity ratio of the negative electrode is represented by a ratio of a capacity of the negative electrode with the rechargeable lithium ion battery in the degraded state to a capacity of the negative electrode with the rechargeable lithium ion battery in the initial state. The battery capacity fluctuation amount is indicated by a product of the capacity of the negative electrode in the degraded state and an amount of a deviation of an axis of a composition of the negative electrode relative to an axis of a composition of the positive electrode in the degraded state.

Preferably, the determination unit is configured to determine whether the negative electrode of the rechargeable lithium ion battery is reusable/recyclable based at least on the second amount calculated by the lithium deposition estimation unit, and the determination unit is also configured to determine whether the positive electrode of the rechargeable lithium ion battery is reusable/recyclable based at least on the capacity ratio of the positive electrode obtained by the degradation parameter acquisition unit.

Still preferably, the determination unit is configured to compare the second amount obtained by the lithium deposition estimation unit with a predetermined determination value to determine whether the negative electrode of the rechargeable lithium ion battery has a recyclable material.

Alternatively, still preferably, the determination unit is configured to determine whether the rechargeable lithium ion battery is reusable/recyclable based on comparison between at least one of the capacity ratio of the positive electrode, the capacity ratio of the negative electrode and the second amount, and a predetermined determination value. The determination value includes a first determination value for determining whether the rechargeable lithium ion battery is reusable, and a second determination value for determining whether the rechargeable lithium ion battery has an electrode with a recyclable material. The determination unit determines that the rechargeable lithium ion battery is reusable when it is determined that the positive electrode and the negative electrode are both reusable/recyclable in accordance with a determination of reusability/recyclability with the first determination value used, and the determination unit determines whether the positive electrode and the negative electrode are recyclable individually in accordance with the determination of reusability/recyclability with the second determination value used.

Preferably, the determination unit is configured to generate information based on a relationship in magnitude between the first and second amounts calculated by the lithium deposition estimation unit to indicate a climate condition suitable for reusing the rechargeable lithium ion battery.

Furthermore, preferably, the determination unit is configured to generate information based on the second amount calculated by the lithium deposition estimation unit to indicate whether it is necessary to perform a process of removing deposited lithium in recycling a material of the negative electrode of the rechargeable lithium ion battery.

Preferably, the degradation parameter acquisition unit includes a measurement unit and a parameter searching unit. The measurement unit is configured to measure the open circuit voltage characteristic, by sensing a voltage and a current output by the rechargeable lithium ion battery as the rechargeable lithium ion battery is electrically charged and discharged and accordingly varies in capacity. The parameter searching unit is configured to determine the open circuit voltage characteristic that allows a minimum voltage error and a minimum capacity error for the open circuit voltage characteristic that is measured by the measurement unit while the capacity ratio of the positive electrode, the capacity ratio of the negative electrode, and the battery capacity fluctuation amount are varied to search for the capacity ratio of the positive electrode of the rechargeable lithium ion battery, the capacity ratio of the negative electrode, and the battery capacity fluctuation amount of the rechargeable lithium ion battery.

Still preferably, the rechargeable lithium ion battery is mounted in an electrically powered vehicle configured to be externally electrically chargeable by a power supply external to the vehicle, and the measurement unit measures the open circuit voltage characteristic when the vehicle is externally electrically charged.

Furthermore, still preferably, the rechargeable lithium ion battery is mounted in an electrically powered vehicle including a hybrid vehicle, and the measurement unit measures the open circuit voltage characteristic by using: the open circuit voltage sensed as based on the voltage output when the rechargeable lithium ion battery is in a relaxed state; and how the battery varies in capacity, as sensed as based on an integral of the current output during each relaxed state.

Alternatively, still preferably, the measurement unit and the parameter searching unit are configured by a control unit mounted in the electrically powered vehicle for managing and controlling electrically charging and discharging the rechargeable lithium ion battery, and the degradation parameter acquisition unit communicates with the control unit to obtain the capacity ratio of the positive electrode, the capacity ratio of the negative electrode, and the battery capacity fluctuation amount.

The present invention in another aspect provides a method for determining degradation of a rechargeable lithium ion battery, including the steps of performing a degradation diagnosis based on an open circuit voltage characteristic of the rechargeable lithium ion battery indicating how the rechargeable lithium ion battery varies in open circuit voltage as the battery varies in capacity to obtain a capacity ratio of a positive electrode of the rechargeable lithium ion battery, a capacity ratio of a negative electrode of the rechargeable lithium ion battery, and a battery capacity fluctuation amount; applying the capacity ratios respectively of the positive and negative electrodes that are obtained to a previously obtained correspondence between the capacity ratios respectively of the positive and negative electrodes and a first amount of the battery capacity fluctuation amount to separate the battery capacity fluctuation amount that is obtained into the first amount and a second amount of the battery capacity fluctuation amount, the first amount corresponding to degradation attributed to wear, the second amount corresponding to degradation attributed to deposition of lithium; and determining whether the rechargeable lithium ion battery is reusable/recyclable based on at least one of: the capacity ratios respectively of the positive and negative electrodes obtained; and the second amount obtained in the step of applying. The capacity ratio of the positive electrode is represented by a ratio of a capacity of the positive electrode with the rechargeable lithium ion battery in a degraded state to a capacity of the positive electrode with the rechargeable lithium ion battery in an initial state. The capacity ratio of the negative electrode is represented by a ratio of a capacity of the negative electrode with the rechargeable lithium ion battery in the degraded state to a capacity of the negative electrode with the rechargeable lithium ion battery in the initial state. The battery capacity fluctuation amount is indicated by a product of the capacity of the negative electrode in the degraded state and an amount of a deviation of an axis of a composition of the negative electrode relative to an axis of a composition of the positive electrode in the degraded state.

Preferably, the step of determining includes the steps of: determining whether the negative electrode of the rechargeable lithium ion battery is reusable/recyclable based at least on the second amount obtained in the step of applying; and determining whether the positive electrode of the rechargeable lithium ion battery is reusable/recyclable based at least on the capacity ratio of the positive electrode obtained.

Still preferably, the step of determining includes the step of comparing the second amount obtained in the step of applying with a predetermined determination value to determine whether the negative electrode of the rechargeable lithium ion battery has a recyclable material.

Alternatively, still preferably, the step of determining includes determining whether the rechargeable lithium ion battery is reusable/recyclable based on comparison between at least one of the capacity ratio of the positive electrode, the capacity ratio of the negative electrode and the second amount, and a predetermined determination value. The determination value includes a first determination value for determining whether the rechargeable lithium ion battery is reusable, and a second determination value for determining whether the rechargeable lithium ion battery has an electrode with a recyclable material. The step of determining includes determining that the rechargeable lithium ion battery is reusable when it is determined that the positive electrode and the negative electrode are both reusable/recyclable in accordance with a determination of reusability/recyclability with the first determination value used, and also determining whether the positive electrode and the negative electrode are recyclable individually in accordance with the determination of reusability/recyclability with the second determination value used.

Preferably, the step of determining includes the step of generating information based on a relationship in magnitude between the first and second amounts obtained in the step of applying to indicate a climate condition suitable for reusing the rechargeable lithium ion battery.

Alternatively, preferably, the step of determining includes the step of generating information based on the second amount obtained in the step of applying to indicate whether it is necessary to perform a process of removing deposited lithium in recycling a material of the negative electrode of the rechargeable lithium ion battery.

Furthermore, preferably, the step of performing includes the steps of measuring the open circuit voltage characteristic by sensing a voltage and a current output by the rechargeable lithium ion battery as the rechargeable lithium ion battery is electrically charged and discharged and accordingly varies in capacity; and determining the open circuit voltage characteristic that allows a minimum voltage error and a minimum capacity error for the open circuit voltage characteristic that is measured while the capacity ratio of the positive electrode, the capacity ratio of the negative electrode, and the battery capacity fluctuation amount are varied to search for the capacity ratio of the positive electrode, the capacity ratio of the negative electrode, and the battery capacity fluctuation amount of the rechargeable lithium ion battery.

Still preferably, the rechargeable lithium ion battery is mounted in an electrically powered vehicle configured to be externally electrically chargeable by a power supply external to the vehicle, and the step of measuring includes measuring the open circuit voltage characteristic when the vehicle is externally electrically charged.

Furthermore, still preferably, the rechargeable lithium ion battery is mounted in an electrically powered vehicle including a hybrid vehicle, and the step of measuring includes measuring the open circuit voltage characteristic by using: the open circuit voltage sensed as based on the voltage output when the rechargeable lithium ion battery is in a relaxed state; and how the battery varies in capacity, as sensed as based on an integral of the current output during each relaxed state.

Still preferably, the step of measuring and the step of determining the open circuit voltage characteristic are performed by a control unit mounted in the electrically powered vehicle for managing and controlling electrically charging and discharging the rechargeable lithium ion battery, and the step of performing includes communicating with the control unit to obtain the capacity ratio of the positive electrode, the capacity ratio of the negative electrode, and the battery capacity fluctuation amount.

Advantageous Effects of Invention

The present invention thus allows whether a degraded rechargeable lithium ion battery is reusable/recyclable to be determined, based on an estimation of an amount of lithium deposited therein, nondestructively without disassembling the battery and appropriately.

DESCRIPTION OF EMBODIMENTS

Hereinafter reference will be made to the drawings to describe the present invention in embodiments. In the figures, identical or corresponding components are identically denoted and will not be described repeatedly in detail.

First Embodiment

General Schematic Configuration

Figure 1:
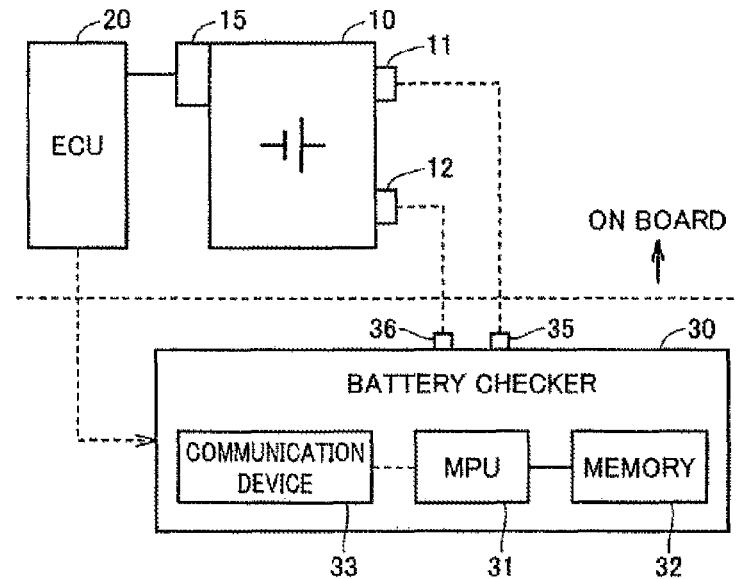
FIG. 1 is a schematic block diagram showing a configuration of a system for determining degradation of a rechargeable lithium ion battery according to an embodiment of the present invention.

FIG. 1 is a schematic block diagram showing a configuration of a system for determining degradation of a rechargeable lithium ion battery according to an embodiment of the present invention.

With reference to FIG. 1, the present degradation determination system includes a rechargeable lithium ion battery 10 subject to determination of degradation, a battery sensor 15 provided at rechargeable lithium ion battery 10, an electronic control unit (ECU) 20 for monitoring and controlling a state of charge of rechargeable lithium ion battery 10, and a battery checker 30.

Rechargeable lithium ion battery 10 has a positive electrode terminal 11 and a negative electrode terminal 12. In FIG. 1, rechargeable lithium ion battery 10 shows a unit subject to determination of degradation. That is, rechargeable lithium ion battery 10 may be a unit cell, or may be a battery block formed of a plurality of unit cells connected, or a battery pack packed with accessories in one piece. The battery pack has a plurality of rechargeable lithium ion batteries electrically connected in series. Herein, the battery pack may internally include rechargeable lithium ion batteries electrically connected in parallel.

Battery sensor 15 generically indicates a voltage sensor, a current sensor, and a temperature sensor, for example, and it is configured to sense the voltage, current, and temperature of rechargeable lithium ion battery 10.

ECU 20 is configured to monitor and control a state of charge of rechargeable lithium ion battery 10 on board, based on the battery's temperature, voltage, and current sensed by battery sensor 15 when the battery is in use. For example ECU 20 estimates a state of charge (typically, an SOC that is represented by a ratio of a currently available capacity to a full charge capacity) of rechargeable lithium ion battery 10 on board when the battery is in use. Alternatively, ECU 20 may set an upper limit for electric power to be charged/discharged based on an SOC, the battery's temperature, and the like as estimated, as occasion requires.

Furthermore, ECU 20 can also diagnose variation of internal resistance and other similar degradation in parallel while rechargeable lithium ion battery 10 is used, i.e., on board. For example. ECU 20 can be configured to diagnose degradation on board and obtain a variety of degradation parameters on board and also record them, as done by the state estimation device described in Japanese Patent Laying-Open No. 2008-241246 (PTL 3). According to an example of PTL 3, the degradation parameters include a diffusion coefficient Ds (diffusion resistance) in an active material of each electrode, direct-current resistance, and the like.

In the present embodiment, determining degradation of rechargeable lithium ion battery 10 involves battery checker 30, which includes a microprocessing unit (MPU) 31, a memory 32, and a communication device 33.

As will be apparent in the following description, determination of degradation of rechargeable lithium ion battery 10 according to the present embodiment, based on a degradation parameter obtained through a diagnosis of degradation on board or off board, determines whether rechargeable lithium ion, battery 10 is reusable/recyclable.

As used herein, "on board" shall indicate a scene in which rechargeable lithium ion battery 10 is used to operate a load (as shown in the figure), and "off board" shall indicate a scene after rechargeable lithium ion battery 10 used when the battery is evaluated by battery checker 30 and the like. Accordingly, on hoard, while ECU 20 operates with rechargeable lithium ion battery 10, battery checker 30 will not be used.

MPU 31 can read a program, data, and the like previously stored in memory 32 to perform a predetermined controlling process accompanied by an operation. Communication device 33 is configured to be capable of wired/wireless data communication with ECU 20. Battery checker 30 thus communicating with ECU 20 via communication device 33 can read from ECU 20 a degradation parameter estimated by ECU 20 on board when rechargeable lithium ion battery 10 is in use.

Furthermore, battery checker 30 can use a charging/discharging device (not shown) for tentatively electrically charging/discharging rechargeable lithium ion battery 10 to diagnose degradation of rechargeable lithium ion battery 10 off board.

Alternatively, the rechargeable lithium ion battery can have positive electrode terminal 11 and negative electrode terminal 12 electrically connected to test terminals 35 and 36 to diagnose degradation of rechargeable lithium ion battery 10 off board. Specifically, when rechargeable lithium ion battery 10 has positive electrode terminal 11 and negative electrode terminal 12 electrically connected to test terminals 35 and 36, respectively, rechargeable lithium ion battery 10 can be electrically charged/discharged by a charging/discharging device (not shown). Then, battery checker 30 can use data measured in electrically charging/discharging the battery off board and follow a procedure of a process previously stored as a program to diagnose degradation.

Figure 2:
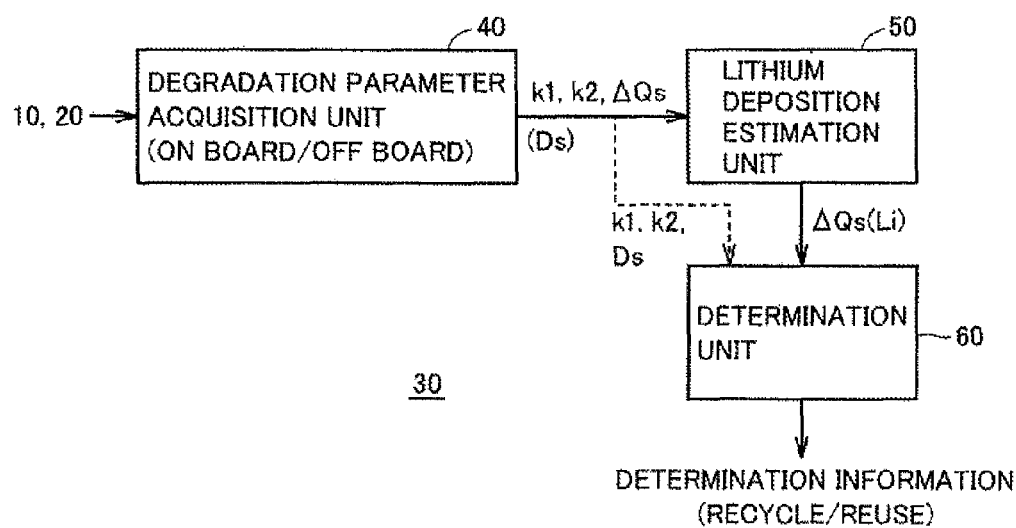
FIG. 2 is a functional block diagram of a function to determine degradation of a rechargeable lithium ion battery according to an embodiment of the present invention.

FIG. 2 is a functional block diagram of a function to determine degradation of a rechargeable lithium ion battery according to the present embodiment of the present invention. FIG. 2 shows functional blocks, which can be implemented for example by MPU 31 performing a predetermined programmed process.

With reference to FIG. 2, a degradation parameter acquisition unit 40 obtains a degradation parameter through an on or off board diagnosis of degradation of rechargeable lithium ion battery 10. This degradation parameter shall include, as will be described in detail later, a positive electrode's capacity ratio k1 defined by a ratio of the positive electrode's capacity in a degraded state to that in an initial state and a negative electrode's capacity ratio k2 defined by a ratio of the negative electrode's capacity in a degraded state to that in an initial state, and a deviated capacity ΔQs corresponding to a deviation of a correspondence in composition between the positive electrode and the negative electrode. Deviated capacity ΔQs corresponds to a "battery capacity fluctuation amount".

Furthermore, the degradation parameters may also include the direct-current resistance and diffusion coefficient Ds indicated in PTL 3.

A lithium deposition estimation unit 50 uses the positive electrode's capacity ratio k1, the negative electrode's capacity ratio k2, and an amount of battery capacity fluctuation (or deviated capacity) ΔQs that are obtained by degradation parameter acquisition unit 40 to calculate a deviated capacity ΔQs(Li) resulting from deposition of lithium in rechargeable lithium ion battery 10 at the negative electrode. ΔQs(Li) has a value quantitatively indicating an amount of lithium deposited on the negative electrode.

Determination unit 60 uses at least one of deviated capacity ΔQs(Li) corresponding to deposition of lithium as obtained by the lithium deposition estimation unit, the positive electrode's capacity ratio k1 and the negative electrode's capacity ratio k2 to determine whether rechargeable lithium ion battery 10 is reusable/recyclable and also generate information on the battery's reusability/recyclability as determined. This determination can also be done using a degradation parameter other than the above (e.g., diffusion coefficient Ds).

The information of the determination generated in determination unit 60 includes information on whether rechargeable lithium ion battery 10 is recyclable and/or information on whether the battery is reusable. Note that in the present embodiment, "recycle" means disassembling rechargeable lithium ion battery 10 and recovering an electrode and other materials to use them again, and "reuse" means avoiding disassembling a unit cell and instead reusing the unit cell, a battery block or a battery pack as it is, or for example replacing a unit cell with another one and thus re-packing it to use it again as a battery pack.

Main Degradation Parameters

Herein, the degradation parameters used in determination on degradation in the present embodiment, i.e., the positive electrode's capacity ratio k1, the negative electrode's capacity ratio k2, and battery capacity fluctuation amount (or deviated capacity) ΔQs, will be described below more specifically.

As is well known, rechargeable lithium ion battery 10 includes a negative electrode, a separator including an electrolyte, and a positive electrode (not shown). The negative electrode and the positive electrode are each configured of an aggregate of spheres of an active material. When the rechargeable lithium ion battery electrically discharges, a chemical reaction is caused on an interface of the active material of the negative electrode to discharge lithium ions $Li^+$ and electrons $e^-$. On the other hand, a chemical reaction is caused on an interface of the active material of the positive electrode to absorb lithium ions $Li^+$ and electrons $e^-$. When the rechargeable lithium ion battery is electrically charged, a reaction opposite to the above reaction is caused.

The negative electrode is provided with a current collector plate absorbing electrons and the positive electrode is provided with a current collector plate discharging electrons. The current collector plate of the negative electrode is formed for example of copper and connected to a negative electrode terminal. The current collector plate of the positive electrode is formed for example of aluminum and connected to a positive electrode terminal. Lithium ions are provided and received between the positive electrode and the negative electrode via the separator to electrically charge/discharge the rechargeable lithium ion battery.

Note that the rechargeable lithium ion battery internally has a state of charge varying with a lithium concentration profile in the active material of each of the positive and negative electrodes. This lithium contributes to a reaction of the rechargeable lithium ion battery.

The rechargeable lithium ion battery outputs voltage V, which is represented by the following expression (1):

$$V = OCV(\theta_1, \theta_2) - R \times I \tag{1}$$

where OCV represents the rechargeable lithium ion battery's open circuit voltage, R represents the rechargeable lithium ion battery's overall resistance, and I represents a current that flows through the rechargeable lithium ion battery. Resistance R includes pure electric resistance against electron transfer at the negative and positive electrodes, and charge-transfer resistance acting equivalently as electric resistance when a reaction current is generated at an interface of the active material.

$\theta_1$ is local SOC obtained at a surface of the active material of the positive electrode, and $\theta_2$ is local SOC obtained at a surface of the active material of the negative electrode. Resistance R has a characteristic which varies with $\theta_1$, $\theta_2$, and the battery's temperature. In other words, resistance R can be represented as a function of $\theta_1$, $\theta_2$, and battery's temperature.

Local SOCs $\theta_1$ and $\theta_2$ are represented by the following expression (2):

$$\theta_i = C_{se,i} / C_{s,i,max} \; (i = 1, 2) \tag{2}$$

where $C_{se,i}$ represents a lithium concentration (as averaged) at an interface of the active material (of the positive or negative electrode), and $C_{s,i,max}$ represents a limit lithium concentration in the active material (of the positive or negative electrode). The limit lithium concentration is an upper limit value of a lithium concentration in the positive/negative electrodes.

Figure 3:
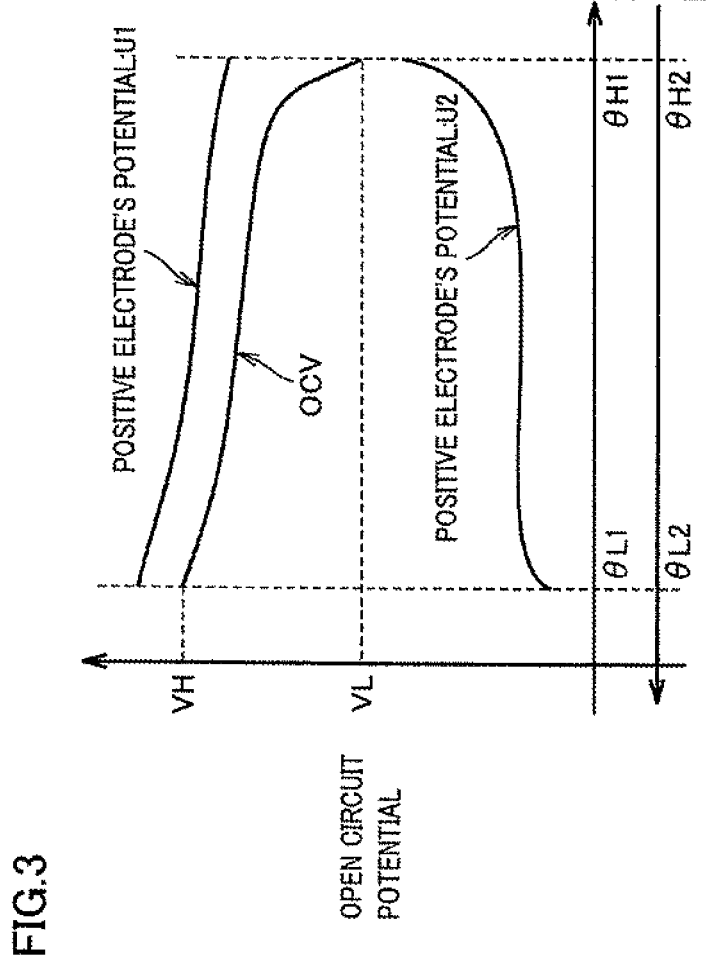
FIG. 3 conceptually represents a characteristic of how open circuit voltage varies with local state of charge (SOC).

FIG. 3 conceptually represents a characteristic of how open circuit voltage varies as local SOC varies.

With reference to FIG. 3, the rechargeable lithium ion battery has open circuit voltage OCV represented as a difference in potential between the positive electrodes open circuit potential U1 and the negative electrode's open circuit potential U2. The positive electrode's open circuit potential U1 has a characteristic varying with local SOC $\theta_1$ obtained at a surface of the active material of the positive electrode, and the negative electrode's open circuit potential U2 has a characteristic varying with local SOC $\theta_2$ obtained at a surface of the active material of the negative electrode.

Measuring a relationship between local SOC $\theta_1$ and the positive electrode's open circuit potential U1 when the rechargeable lithium ion battery is in an initial state allows a characteristic to be obtained that represents the relationship between local SOC $\theta_1$ and the positive electrode's open circuit potential U1 (i.e., a curve for U1 represented in FIG. 3). The initial state means a state in which the rechargeable lithium ion battery is not degraded, and for example means a state of the rechargeable lithium ion battery immediately after the battery is produced.

Measuring a relationship between local SOC $\theta_2$ and the negative electrode's open circuit potential U2 when the rechargeable lithium ion battery is in the initial state allows a characteristic to be obtained that represents the relationship between local SOC $\theta_2$ and the negative electrode's open circuit potential U2 (i.e., a curve for U2 represented in FIG. 3). Data representing these characteristics (U1, U2) can previously be stored in a memory in the form of a map.

The rechargeable lithium ion battery's open circuit voltage OCV has a characteristic decreasing as the battery is electrically discharged. Furthermore, the rechargeable lithium ion battery in a degraded state has voltage decreased in a larger amount than in the initial state for the same electrically discharging period of time. This indicates that as the rechargeable lithium ion battery degrades, its full charge capacity is reduced and its open circuit voltage characteristic has varied.

In the present embodiment, the variation of the open circuit voltage characteristic of the rechargeable lithium ion battery that accompanies the battery's degradation is modeled as two phenomena believed to occur in the rechargeable lithium ion battery in a degraded state. These two phenomena are reduction in a single electrode's capacity at the positive/negative electrodes, and a deviation of a correspondence in composition between the positive electrode and the negative electrode.

Reduction in a single electrode's capacity represents reduction in an ability to accept lithium in each of the positive electrode and the negative electrode. That the ability to accept lithium is decreasing means that the active material and the like that function effectively for electrically charging/discharging the battery is decreasing.

Figure 4:
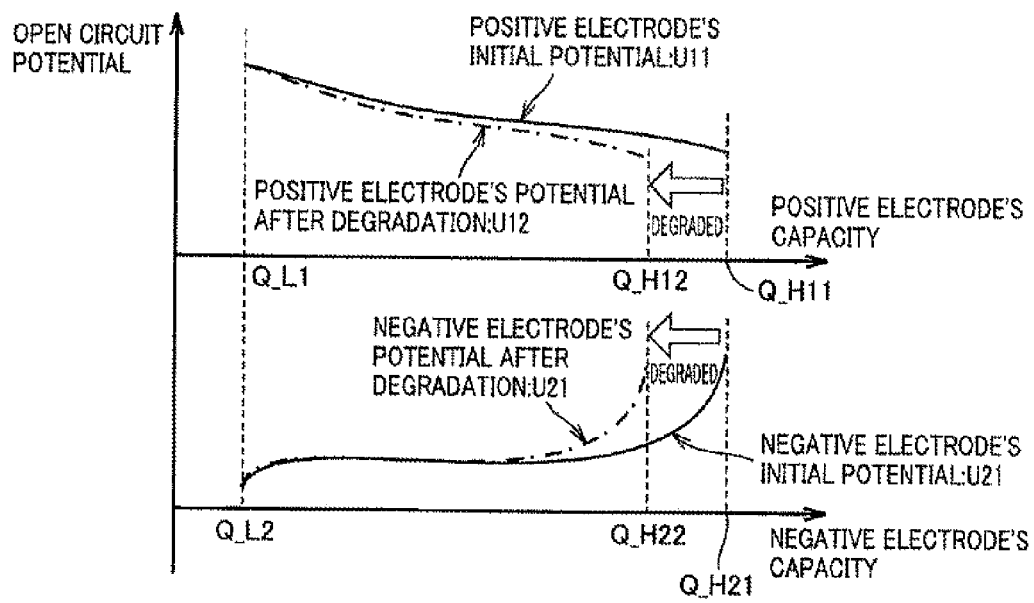
FIG. 4 is a graph schematically showing how a single electrode's open circuit potential varies as its capacity decreases.

FIG. 4 is a graph schematically showing how a single electrode's open circuit potential varies as its capacity decreases.

In FIG. 4, on the axis of the positive electrode's capacity, Q_L1 is a capacity corresponding to local SOC=$\theta$L1 in FIG. 3 when the rechargeable lithium ion battery is in the initial state. Q_H11 is a capacity corresponding to local SOC=$\theta$H1 in FIG. 3 when the rechargeable lithium ion battery is in the initial state. Furthermore, on the axis of the negative electrode's capacity, Q_L2 is a capacity corresponding to local SOC=$\theta$L2 in FIG. 3 when the rechargeable lithium ion battery is in the initial state, and Q_H21 is a capacity corresponding to local SOC=$\theta$H2 in FIG. 3 when the rechargeable lithium ion battery is in the initial state.

When the positive electrode has a reduced ability to accept lithium, the positive electrode's capacity corresponding to local SOC $\theta_1$ varies from Q_H11 to Q_H12. Furthermore, when the negative electrode has a reduced ability to accept lithium the negative electrode's capacity corresponding to SOC $\theta_2$ varies from Q_H21 to Q_H22.

Note that if the rechargeable lithium ion battery degrades, local SOC $\theta_1$ and the positive electrode's open circuit potential U1 have their relationship (see FIG. 3) unchanged. As such, when the relationship between local SOC $\theta_1$ and the positive electrode's open circuit potential U1 is converted into a relationship between the positive electrode's capacity and the positive electrode's open circuit potential, then, as represented in FIG. 4, the relationship between the positive electrode's capacity and the positive electrode's open circuit potential will be represented by a curve shrunk relative to that in the initial state by the rechargeable lithium ion battery's degradation.

Furthermore, when the relationship between local SOC $\theta_2$ and the negative electrode's open circuit potential U2 is converted into a relationship between the negative electrode's capacity and the negative electrode's open circuit potential, then, as represented in FIG. 4, the relationship between the negative electrode's capacity and the negative electrode's open circuit potential will be represented by a curve shrunk relative to that in the initial state by the rechargeable lithium ion battery's degradation.

Figure 5:
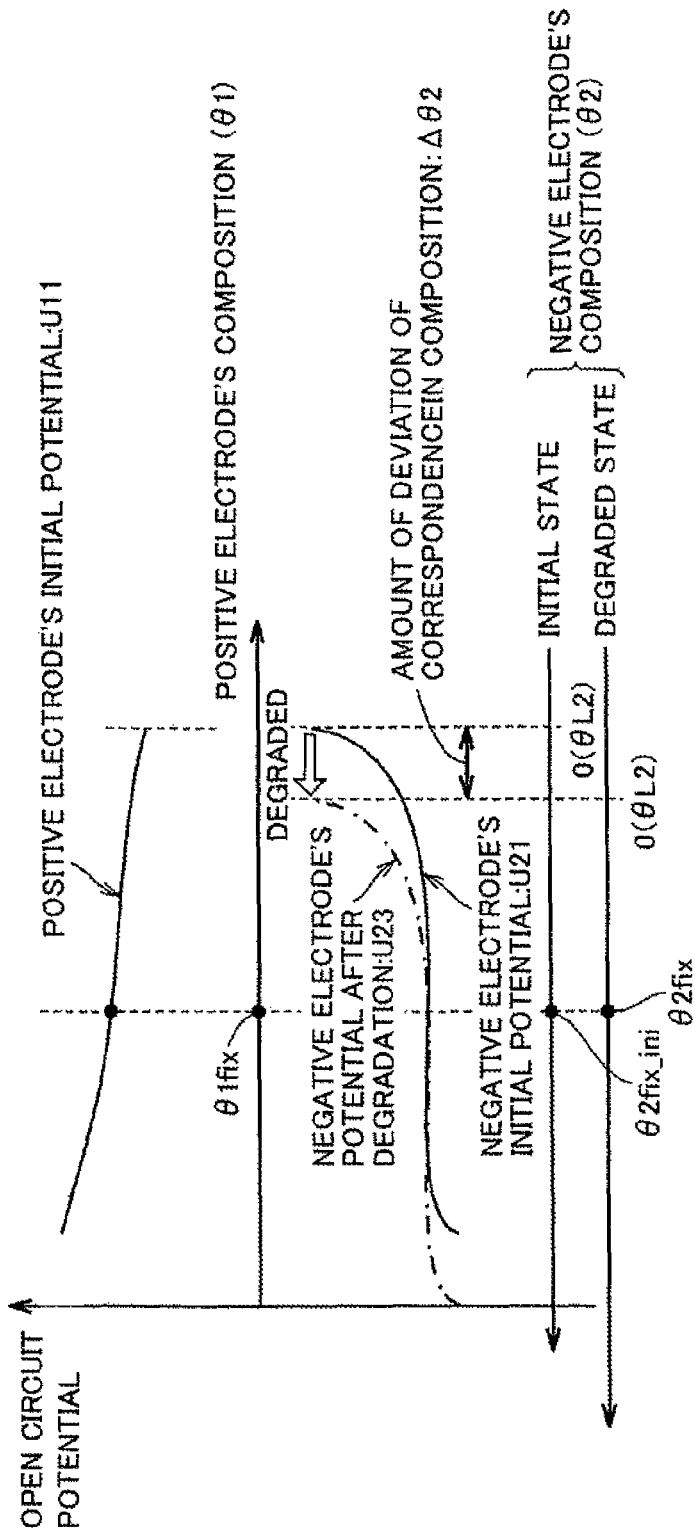
FIG. 5 is a conceptual diagram schematically representing a relationship between a deviation of a correspondence in composition between a positive electrode and a negative electrode, and their open circuit potentials.

FIG. 5 is a conceptual diagram schematically representing a relationship between a deviation of a correspondence in composition between the positive electrode and the negative electrode, and their open circuit potentials. A deviation of a correspondence in composition indicates that when a set of a positive electrode and a negative electrode is used to electrically charge/discharge a rechargeable lithium ion battery the positive electrode's composition ($\theta_1$) and the negative electrode's composition (θ2) in combination have a deviation from the initial state of the battery.

Single electrodes' respective compositions θ1, θ2 and open circuit potentials U1, U2 have a relationship represented by a curve similar to that represented in FIG. 3. Note that when the rechargeable lithium ion battery is degraded, the axis of the negative electrode's composition θ2 will shift by Δθ2 in a direction in which the positive electrode's composition θ1 decreases. Thus the negative electrode's composition 82 and the negative electrode's open circuit potential U2 have a relationship represented by a curve shifted in a direction in which the positive electrode's composition θ1 decreases relative to a curve in the initial state by Δθ2.

The negative electrode's composition corresponding to the positive electrode's composition θ1*fix* with the rechargeable lithium ion battery in the initial state will be "θ2*fix*_ini", and once the rechargeable lithium ion battery has been degraded it will be "θ2*fix*". Note that in FIG. 5 the negative electrode's composition θL2 represented in FIG. 3 is 0, which represents that the negative electrode's lithium has all been drawn out.

The present embodiment introduces the above three degradation parameters of the positive electrode's capacity ratio k1, the negative electrode's capacity ratio k2, and an amount of deviation ΔQs of a correspondence in composition between positive and negative electrodes to model the above two degradation phenomena.

The positive electrode's capacity ratio k1 is defined by a ratio of the positive electrode's capacity in a degraded state to that in an initial state, as described above. Herein, when it is assumed that the positive electrode's capacity is reduced by any amount from its initial capacity after the rechargeable lithium ion battery is degraded, then the positive electrode's capacity ratio k1 is represented by the following expression (3):

$$k1 = (Q1\_ini - \Delta Q1)/Q1\_ini$$

wherein $0 < k1 < 1$ (3), where Q1_ini represents the positive electrodes capacity with the rechargeable lithium ion battery in the initial state (Q_H11 represented in FIG. 4) and ΔQ1 represents an amount by which the positive electrode's capacity decreases when the rechargeable lithium ion battery is degraded. The positive electrode's capacity Q1_ini can be previously obtained through an experiment.

The negative electrode's capacity ratio k2 is defined by a ratio of the negative electrode's capacity in a degraded state to that in the initial state, as described above. Herein, when it is assumed that the negative electrode's capacity is reduced by any amount from its initial capacity after the rechargeable lithium ion battery is degraded, then, the negative electrode's capacity ratio k2 is represented by the following expression (4):

$$k2 = (Q2\_ini - \Delta Q2)/Q2\_ini$$

wherein $0 < k2 < 1$ (4), where Q2_ini represents the negative electrode's capacity with the rechargeable lithium ion battery in the initial state (Q_H21 represented in FIG. 4) and ΔQ2 represents an amount by which the negative electrode's capacity decreases when the rechargeable lithium ion battery is degraded. The negative electrode's capacity Q2_ini can be previously obtained through an experiment.

Figure 6:
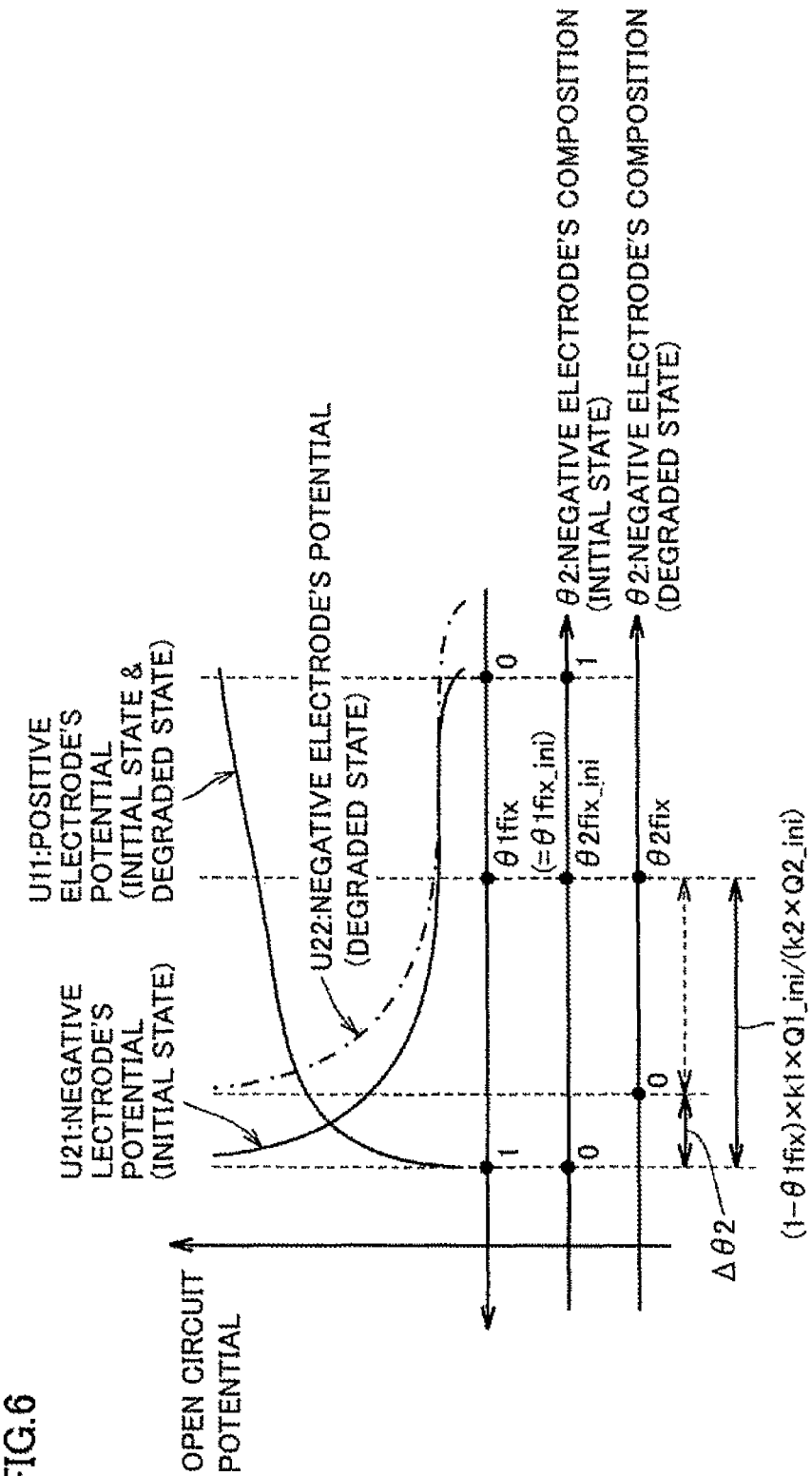
FIG. 6 is a schematic diagram for illustrating a deviation of a correspondence in composition caused by degradation.

FIG. 6 is a schematic diagram for illustrating a deviation of a correspondence in composition caused by degradation.

When the rechargeable lithium ion battery is degraded, the negative electrode with its composition θ2 of 1 will have a capacity of Q2_ini−ΔQ2. Furthermore, the positive electrode and the negative electrode have their respective compositions having a correspondence with a deviated capacity ΔQs which is a capacity corresponding to an amount of deviation Δθ2 of the axis for the negative electrode's composition relative to that for the positive electrode's composition. Thus the relationship of the following expression (5) is established:

$$1:\Delta\theta 2 = (Q2\_Ini - \Delta Q2):\Delta Qs$$ (5).

From expression (4) and expression (5), the following expression (6) is obtained:

$$\Delta Qs = (Q2\_ini - \Delta Q2) \times \Delta\theta 2$$ (6)
$$= k2 \times Q2\_ini \times \Delta\theta 2.$$

When the rechargeable lithium ion battery is in the initial state, the positive electrode's composition θ1*fix*_ini corresponds to the negative electrode's composition θ2*fix*_ini. When the rechargeable lithium ion battery is in a degraded state, the positive electrode's composition θ1*fix* corresponds to the negative electrode's composition θ2*fix*. Furthermore, the deviation of the correspondence in composition is with reference to the positive electrode's composition θ1*fix* in the initial state. That is, the positive electrode's compositions θ1*fix* and θ1*fix*_ini are equal in value.

When the rechargeable lithium ion battery's degradation results in the positive and negative electrodes having their respective compositions having a correspondence with a deviation, the rechargeable lithium ion battery degraded has the positive and negative electrodes with their respective compositions θ1*fix* and θ2*fix* having a relationship of the following expressions (7) and (8):

$$\theta 1 fix = \theta 1 fix\_ini$$ (7), $$\theta 2 fix = [(1 - \theta 1 fix) \times k1 \times Q1\_ini - \Delta Qs]/(k2 \times Q2\_ini)$$ (8).

Expression (8) has a meaning, as described hereinafter. When the rechargeable lithium ion battery degrades, and accordingly, the positive electrode's composition θ1 varies (or is reduced) from 1 to θ1*fix*, the positive electrode discharges lithium in an amount represented by the following expression (9):

The positive electrode discharges lithium in an
amount$= (1 - \theta 1 fix) \times k1 \times Q1\_ini$ (9).

Herein, 1−θ1*fix* has a value indicating how much the positive electrode's composition varies as the rechargeable lithium ion battery is degraded, and k1×Q1_ini has a value indicating the positive electrode's capacity after the rechargeable lithium ion battery is degraded.

If the lithium discharged from the positive electrode is all taken into the negative electrode, then the negative electrode's composition θ2*fix* will be represented by the following expression (10):

$$\theta 2 fix = (1 - \theta 1 fix) \times k1 \times Q1\_ini/(k2 \times Q2\_ini)$$ (10).

Herein, k2×Q2_ini has a value representing the negative electrode's capacity after the rechargeable lithium ion battery is degraded.

On the other hand, when the positive and negative electrodes have compositions, respectively, having a correspondence with a deviation (Δθ2) then the negative electrode's composition θ2fix is represented by the following expression (11):

$$\theta 2fix = (1-\theta 1fix) \times k1 \times Q1\_ini/(k2 \times Q2\_ini) - \Delta\theta 2 \quad (11).$$

The amount of deviation Δθ2 of the correspondence in composition can be represented by expression (6), using deviated capacity ΔQs of the correspondence in composition. Thus the negative electrode's composition θ2fix is represented by the above expression (8).

As shown in FIG. 6, when the rechargeable lithium ion battery is in a degraded state, open circuit voltage OCV is represented as a potential difference between the positive electrode's open circuit potential U11 and the negative electrode's open circuit potential U22 in the degraded state. That is, estimating three degradation parameters k1, k2, ΔQs allows the negative electrode's open circuit potential U22 with the rechargeable lithium ion battery in a degraded state to be determined, and open circuit voltage OCV can be calculated as a potential difference between the negative electrode's open circuit potential U22 and the positive electrode's open circuit potential U11.

Furthermore, in the present embodiment, degradation parameters k1, k2, and ΔQs are used to estimate the rechargeable lithium ion battery's internal state, more specifically, whether the rechargeable lithium ion battery is degraded as lithium deposits. Generally, a rechargeable lithium ion battery's degradation includes that attributed to deposition of lithium and that attributed to wear, and distinguishing these types of degradation and thus determining (or estimating) them allows a state of degradation to be determined in detail.

Degradation attributed to wear means that as a battery electrically conducts or is left or the like its positive and negative electrodes performance (or ability to accept lithium) is impaired, and for example, it includes that the positive/negative electrodes have their active materials worn. Furthermore, a deviated capacity resulting from a coating or the like provided on a surface of an active material (or degradation in composition between the positive electrode and the negative electrode) is also indicated as an example of degradation attributed to wear. On the other hand, degradation attributed to deposition of lithium indicates that the lithium ions used for a battery's reaction change into a byproduct (mainly, metallic lithium), and thus no longer contribute to cell reaction.

When the rechargeable lithium ion battery is not degraded, open circuit voltage OCV will coincide with that of the rechargeable lithium ion battery in the initial state. That is, when the positive electrodes capacity ratio k1 and the negative electrode's capacity ratio k2 are 1 and deviated capacity ΔQs of the correspondence in composition is 0, open circuit voltage OCV calculated (or estimated) as described above will coincide with a value of open circuit voltage OCV (as measured) that is obtained when the rechargeable lithium ion battery is in the initial state (or unused).

Figure 7:
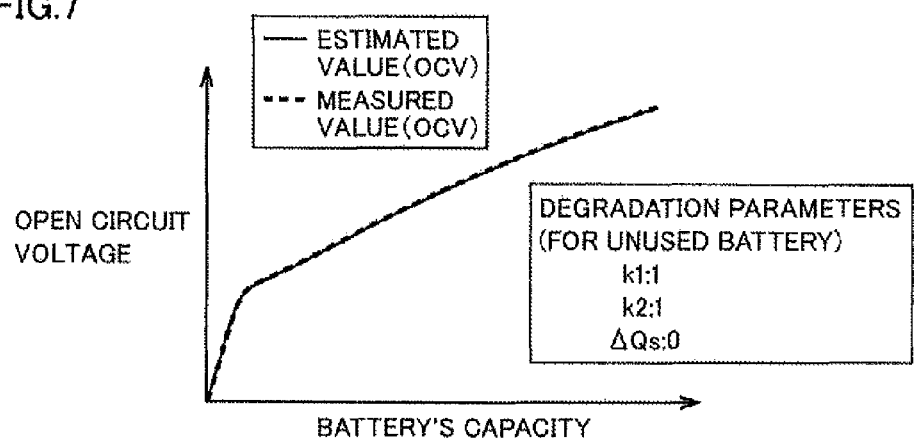
FIG. 7 is a figure for illustrating a degradation parameter when an unused rechargeable lithium ion battery's open circuit voltage curve as estimated is brought to coincide with that as measured.

FIG. 7 shows a relationship between the rechargeable lithium ion battery's capacity (SOC) and open circuit voltage OCV (i.e., an open circuit voltage characteristic). Hereinafter, a curve shown in FIG. 7 and the like that represents an open circuit voltage characteristic will also be referred to as an "open circuit voltage curve." In FIG. 7, a dotted line indicates an open circuit voltage curve (as measured), and a solid line indicates an open circuit voltage curve (as estimated). The open circuit voltage curve (as estimated) overlaps the open circuit voltage curve (as measured).

In FIG. 7, the axis of ordinate represents open circuit voltage OCV, and the axis of abscissa represents the rechargeable lithium ion battery's capacity.

When the rechargeable lithium ion battery degrades, open circuit voltage (as measured) OCV will vary. Herein, FIG. 8 (a figure corresponding to FIG. 7) shows a dotted line, which indicates a result of having measured an open circuit voltage curve (as measured) of a rechargeable lithium ion battery degraded only by deposition of lithium, that is, a rechargeable lithium ion battery free of degradation attributed to wear.

If the rechargeable lithium ion battery is held at low temperature, degradation attributed to wear can be suppressed, and this allows deposition of lithium to be alone caused while degradation attributed to wear is suppressed. By conducting an experiment of whether degradation attributed to wear is caused under a plurality of temperature conditions, a temperature set to set the rechargeable lithium ion battery at low temperature can be determined. This allows degradation attributed to deposition of lithium to be alone caused in the rechargeable lithium ion battery.

Figure 8:
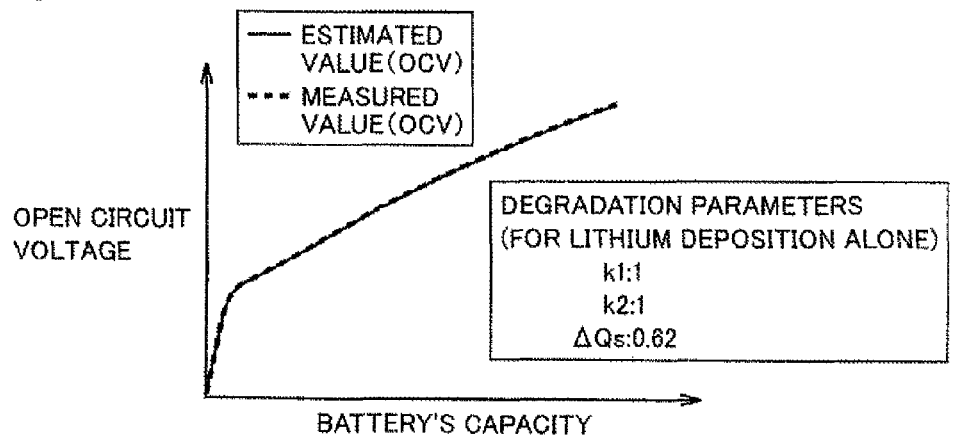
FIG. 8 is a figure for illustrating a degradation parameter when an open circuit voltage curve (as estimated) is brought to coincide with an open circuit voltage curve (as measured) in a case where degradation attributed to deposition of lithium is alone caused.

Correctly estimating the three degradation parameters (k1, k2, ΔQs) allows an open circuit voltage curve (as estimated) to substantially coincide with the open circuit voltage curve (as measured) represented in FIG. 8. In other words, the three degradation parameters can be searched for to cause the open circuit voltage curve (as estimated) to substantially coincide with the open circuit voltage curve (as measured).

FIG. 8 represents open circuit voltage (as measured) OCV and open circuit voltage (as estimated) OCV substantially coinciding with each other. This open circuit voltage curve (as estimated) is determined with degradation parameters as follows: the positive electrode's capacity ratio k1 of 1; the negative electrode's capacity ratio k2 of 1; and the compositions having a correspondence with deviated capacity ΔQs of 062. These degradation parameter values can be obtained by searching for and obtaining the three degradation parameters (k1, k2, ΔQs) allowing the open circuit voltage curve (as estimated) to substantially coincide with the open circuit voltage curve (as measured) represented in FIG. 8.

Figures 9, 10:
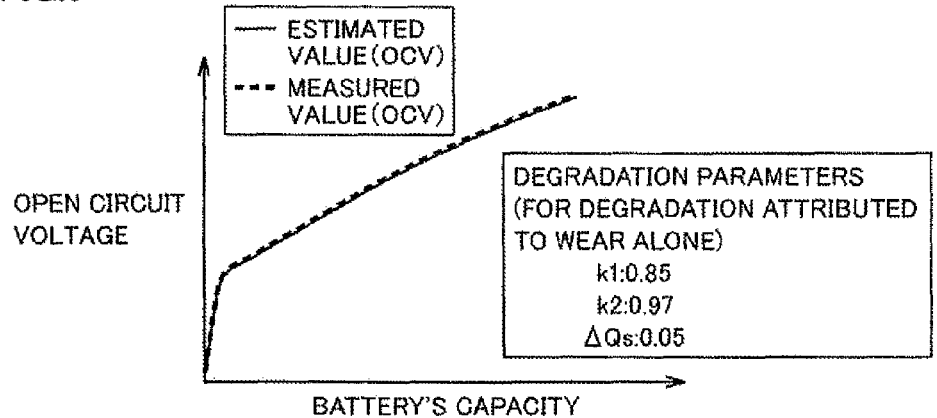
FIG. 9 is a figure for illustrating a degradation parameter when an open circuit voltage curve (as estimated) is brought to coincide with an open circuit voltage curve (as measured) in a case where degradation attributed to wear is alone caused.
FIG. 10 represents a relationship between positive and negative electrodes' capacity ratios and a capacity corresponding to a deviation of a correspondence in composition between the electrodes when degradation attributed to wear is alone caused.

FIG. 9 indicates a result of having measured an open circuit voltage curve (as measured) of a rechargeable lithium ion battery degraded by wear alone, that is, a rechargeable lithium ion battery which does not have lithium deposited therein. In FIG. 9, the axis of ordinate represents open circuit voltage OCV, and the axis of abscissa represents the rechargeable lithium ion battery's capacity.

If the rechargeable lithium ion battery is held at high temperature, deposition of lithium can be suppressed, and this allows degradation attributed to wear to be alone caused while deposition of lithium is suppressed. By conducting an experiment of whether lithium deposits under a plurality of temperature conditions, a temperature set to set the rechargeable lithium ion battery at high temperature can be determined. The temperature set can be 50° C., for example. This allows degradation attributed to wear to be alone caused in the rechargeable lithium ion battery.

FIG. 9 represents open circuit voltage (as measured) OCV and open circuit voltage (as estimated) OCV substantially coinciding with each other. At the time, an open circuit voltage curve (as estimated) is determined with degradation parameters as follows: the positive electrode's capacity ratio k1 of 0.85; the negative electrode's capacity ratio k2 of 0.97; and the compositions having a correspondence with deviated capacity ΔQs of 0.05. These degradation parameter values can be obtained by searching for and obtaining the three degradation parameters (k1, k2, ΔQs) allowing the open circuit voltage curve (as estimated) to substantially coincide with the open circuit voltage curve (as measured) represented in FIG. 9.

As shown in FIG. 8 and FIG. 9, it can be seen that the rechargeable lithium ion battery that is degraded only by deposition of lithium has only one of the three degradation parameters (k1, k2, ΔQs), i.e., deviated capacity ΔQs of the correspondence in composition, varied from ΔQs (=0) of the rechargeable lithium ion battery unused (or in the initial state).

Furthermore, it can be seen that the rechargeable lithium ion battery degraded only by wear has the three degradation parameters (k1, k2, ΔQs) all deviating from those of the rechargeable lithium ion battery unused (or in the initial state). Note that degradation attributed to wear provides the compositions with a correspondence therebetween having a deviated capacity ΔQs smaller than degradation attributed to deposition of lithium does.

Lithium may deposit because, for example, lithium ions discharged from the positive electrode in electrically charging the battery may not be taken into the negative electrode. In that case, the positive electrode and the negative electrode will have their compositions with a correspondence having a deviation, and deviated capacity ΔQs will vary. Furthermore, deposition of lithium caused alone does not impair the positive and negative electrodes' ability to accept lithium, and accordingly, the positive electrode's capacity ratio k1 and the negative electrode's capacity ratio k2 will each be held at 1.

Thus, deviated capacity ΔQs includes a deviated capacity ΔQs(Li) resulting from degradation attributed to deposition of lithium, and a deviated capacity ΔQs(W) resulting from degradation attributed to wear, and accordingly, separating one from the other allows quantitative estimation of an amount of lithium deposited.

Initially, a map used to identify a component of degradation that is attributed to wear will be described. This map represents a correspondence between the positive and negative electrodes' capacity ratios k1 and k2 and the deviated capacity ΔQs of a correspondence in composition when the rechargeable lithium ion battery is degraded by wear alone, and it can be previously created based on a result of an experiment. As has been set forth above, holding the rechargeable lithium ion battery at high temperature can prevent deposition of lithium, and thus allows an experiment to be conducted to cause degradation attributed to wear alone.

Degradation attributed to wear is advanced gradually to decrease the rechargeable lithium ion battery's capacity (i.e., full charge capacity) gradually by a predetermined amount. Whenever the rechargeable lithium ion battery's capacity is decreased, the rechargeable lithium ion battery's open circuit voltage OCV is measured. This allows data to be obtained that indicates how the rechargeable lithium ion battery varies in open circuit voltage OCV as the rechargeable lithium ion battery varies in capacity when the rechargeable lithium ion battery has its capacity degraded as prescribed (i.e., an open circuit voltage curve (as measured)). For example, until the rechargeable lithium ion battery has a capacity reaching from 100% to 50%, the capacity is decreased (or degraded) by 5% at a time, and whenever the capacity is decreased, the rechargeable lithium ion battery's open circuit voltage OCV is measured.

Then, the degradation parameters (the positive electrode's capacity ratio k1, the negative electrode's capacity ratio k2, and deviated capacity ΔQs) can be searched for for causing open circuit voltage (as estimated) OCV to coincide with open circuit voltage (as measured) OCV obtained for each capacity degradation.

Thus, the map (hereinafter also referred to as a map for degradation attributed to wear) shown in FIG. 10 can be obtained. The FIG. 10 map shows a correspondence between the positive and negative electrodes capacity ratios k1 and k2 and deviated capacity ΔQs(W), and for example, the positive electrode's capacity ratio k1 and the negative electrode's capacity ratio k2 can be selected to determine deviated capacity ΔQs(W) resulting from degradation attributed to wear. The map can be stored in a memory.

Note that in the present embodiment, obtaining data indicating how rechargeable lithium ion battery 10 subject to determination of degradation, as shown in FIG. 1, varies in open circuit voltage (as measured) OCV as the battery varies in capacity (i.e., an open circuit voltage curve), as shown in FIG. 7 to FIG. 9, allows degradation parameters (k1, k2, ΔQs) to be searched for so that open circuit voltage (as estimated) OCV may coincide with open circuit voltage (as measured) OCV.

An open circuit voltage curve can be measured through electrically charging/discharging rechargeable lithium ion battery 10 that has completely been used off board. Specifically, rechargeable lithium ion battery 10 is electrically charged/discharged off board and thus varied in capacity, and in doing so, the battery's voltage and current are also sensed to measure an open circuit voltage characteristic. Furthermore, degradation parameter acquisition unit 40 can use the measured open circuit voltage characteristic to search for degradation parameters (k1, k2, ΔQs) to obtain the positive electrodes capacity ratio k1, the negative electrode's capacity ratio k2, and battery capacity fluctuation amount (or deviated capacity) ΔQs.

Alternatively, it is also possible to measure an open circuit voltage curve by ECU 20 on board when rechargeable lithium ion battery 10 is used. For example, when rechargeable lithium ion battery 10 is relaxed (or a state with the battery's current=0 continues), the battery's voltage is sensed and how the battery's open circuit voltage varies is measured therefrom, and the battery's current is integrated, and from the integral, how the battery's capacity varies can be measured. The measured open circuit voltage curve can be used to allow ECU 20 to search for degradation parameters (k1, k2, ΔQs). In that case, battery checker 30 obtains the positive electrodes capacity ratio k11, the negative electrode's capacity ratio k2, and battery capacity fluctuation amount (or deviated capacity) ΔQs by communicating with ECU 20.

Lithium deposition estimation unit 50 refers to the FIG. 10 map for degradation attributed to wear and uses the obtained positive and negative electrodes capacity ratios k1 and k2 to calculate deviated capacity ΔQs(W) resulting from degradation attributed to wear. Furthermore, lithium deposition estimation unit 50 subtracts deviated capacity ΔQs(W) from deviated capacity ΔQs that degradation parameter acquisition unit 40 has obtained to calculate deviated capacity ΔQs(Li) resulting from deposition of lithium. Thus, deviated capacity ΔQs can be separated into deviated capacity ΔQs(Li) resulting from deposition of lithium, and deviated capacity ΔQs(W) resulting from degradation attributed to wear. That is, ΔQs(W) corresponds to a "first amount of the battery capacity fluctuation", and ΔQs(Li) corresponds to a "second amount of the battery capacity fluctuation".

Figure 11:
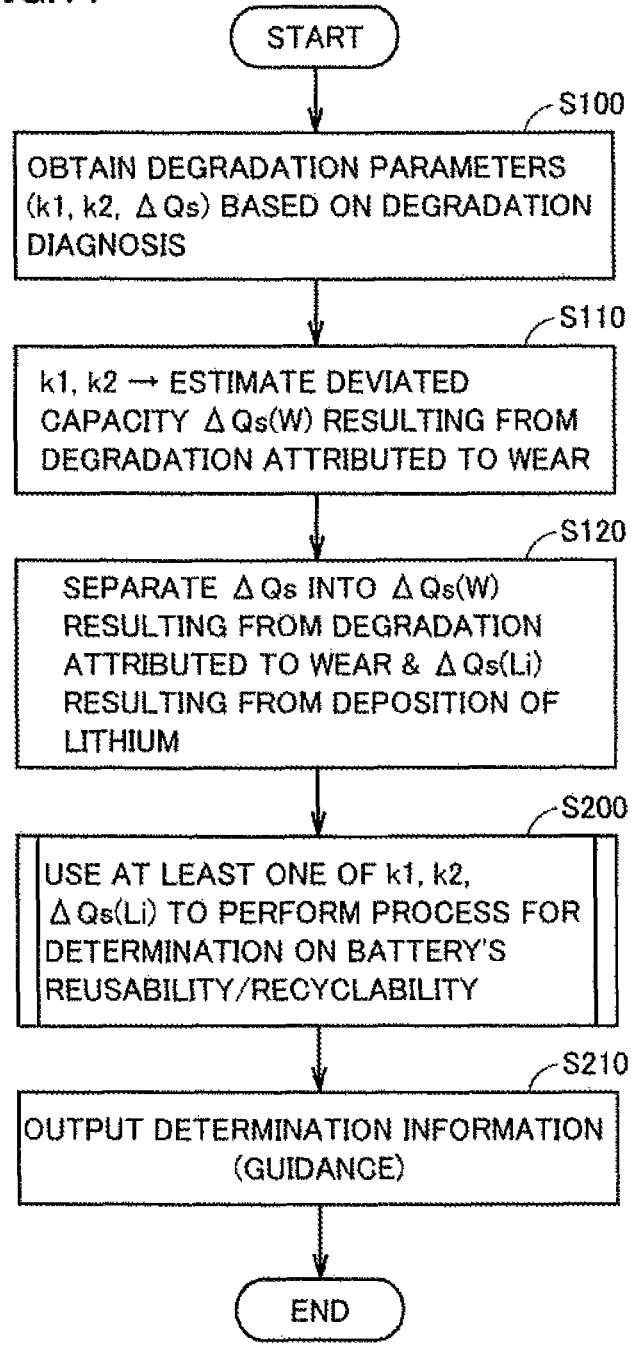
FIG. 11 is a flowchart representing a procedure of a process for determining degradation of a rechargeable lithium ion battery according to an embodiment of the present invention.

FIG. 11 is a flowchart representing a procedure of a process for determining degradation of a rechargeable lithium ion battery according to the present embodiment of the present invention. The FIG. 11 flowchart represents a controlling process implemented when for example MPU 31 shown in FIG. 1 executes a program stored previously.

With reference to FIG. 11, MPU 31 at Step S100 obtains a degradation parameter based on an on or off board degradation diagnosis of rechargeable lithium ion battery 10. As has been described above, the degradation diagnosis is based on an open circuit voltage characteristic of rechargeable lithium ion battery 10 (FIG. 7 to FIG. 9). The degradation parameter obtained through the degradation diagnosis includes at least the positive electrode's capacity ratio k1, the negative electrode's capacity ratio k2, and deviated capacity ΔQs. That is, Step S100 corresponds to a function of degradation parameter acquisition unit 40 described above.

MPU 31 at Step S110 applies the positive and negative electrodes capacity ratios k1 and k2 that are obtained at Step S100 to the FIG. 10 map to estimate deviated capacity ΔQs (W) resulting from degradation attributed to wear. Furthermore, MPU 31 at Step S120 separates deviated capacity ΔQs that is obtained at Step S100 into ΔQs(W) calculated at Step S110, and deviated capacity ΔQs(Li) resulting from deposition of lithium. That is, ΔQs(Li)=ΔQs ΔQs(W) is performed. Steps S110 and S120 are equivalent to a function of lithium deposition estimation unit 50 (see FIG. 2).

Furthermore, MPU 31 at Step S200 uses at least one of the positive electrode's capacity ratio k1, the negative electrode's capacity ratio k2, and deviated capacity ΔQs(Li) resulting from deposition of lithium to perform a process for determination on the battery's reusability/recyclability. MPU 31 at Step S210 outputs information of determination reflecting the S200 result as guidance information for reusability/recyclability.

Figure 12:
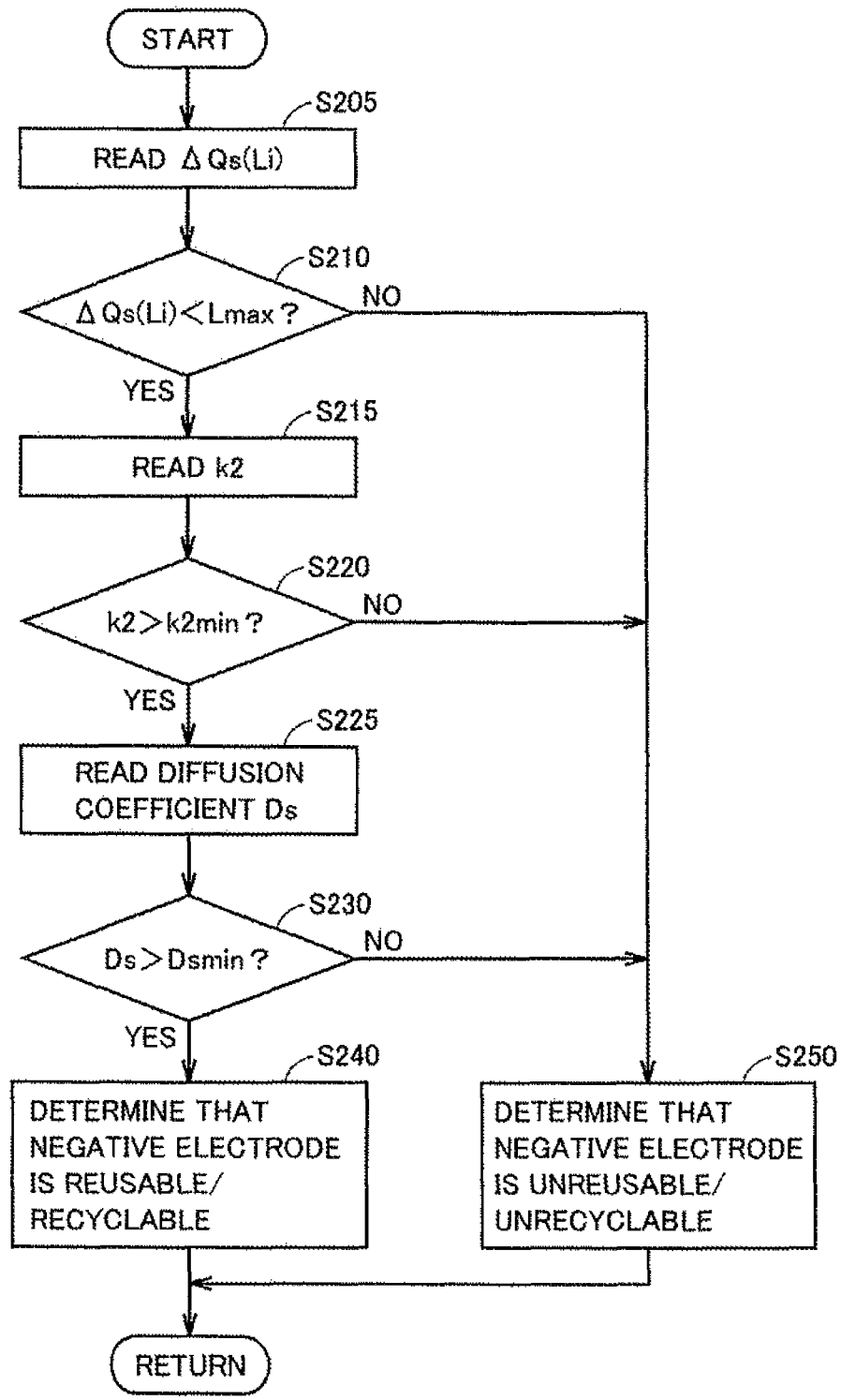
FIG. 12 is a flowchart specifically showing a procedure of a process for determination of reusability/recyclability for a negative electrode of a rechargeable lithium ion battery.

The S200 determination process will be described more specifically. FIG. 12 specifically illustrates how whether a rechargeable lithium ion battery has a reusable/recyclable negative electrode is determined.

With reference to FIG. 12, MPU 31 at Step S205 reads deviated capacity ΔQs(Li) resulting from deposition of lithium, as obtained at Step S120. Then, MPU 31 proceeds to Step S210 to compare the read ΔQs(Li) with a predetermined determination value Lmax.

As has been described above, ΔQs(Li) has larger values for lithium deposited in larger amounts. Accordingly, when ΔQs (Li) is determination value Lmax or larger (NO at S210), it can be inferred that lithium deposits on the negative electrode beyond a reusable/recyclable level. Accordingly, MPU 31 proceeds to Step S250 to determine that the negative electrode is unreusable/unrecyclable.

On the other hand, when ΔQs(Li) is smaller than determination value Lmax (YES at S210), then MPU 31 determines, in terms of deposition of lithium, that the negative electrode is reusable/recyclable, and accordingly, MPU 31 performs determination based on a still another degradation parameter.

For example MPU 31 at Step S215 reads the negative electrode's capacity ratio k2 obtained at Step S100 and MPU 31 at Step S220 compares the negative electrode's capacity ratio k2 with a determination value k2 min. When the negative electrode's capacity ratio k2 is determination value k2 min or smaller (NO at S220), it is determined that the negative electrode's capacity is decreased beyond the reusable/recyclable level. Accordingly, MPU 31 proceeds to Step S250 to determine that the negative electrode is unreusable/unrecyclable.

On the other hand, when the negative electrode's capacity ratio k2 is larger than determination value k2 min (YES at S220), then. MPU 31 determines, in terms of deposition of lithium and the negative electrodes capacity, that the negative electrode is reusable/recyclable, and accordingly, MPU 31 performs determination based on a still another degradation parameter.

For example MPU 31 at Step S225 further reads diffusion coefficient Ds and also compares diffusion coefficient Ds with a determination value Dsmin. Diffusion coefficient Ds is acquirable for example by using the same technique as described in PTL 3.

When diffusion coefficient Ds is equal to or smaller than determination value Dsmin and the diffusion resistance has attained a predetermined level (NO at S230), MPU 31 proceeds to Step S250 to determine that the negative electrode is unreusable/unrecyclable. On the other hand, if diffusion coefficient Ds is larger than determination value Dsmin and the diffusion resistance has not attained the predetermined level, MPU 31 proceeds to Step S240.

Since each degradation parameter subject to determination satisfies a determination value, MPU 31 at Step S240 determines that the negative electrode is reusable/recyclable. Note that in the FIG. 12 determination of whether the negative electrode is reusable/recyclable essentially requires the determination done at Steps S205 and S210 using deviated capacity ΔQs(Li) resulting from deposition of lithium. On the other hand, the determination based on the negative electrode's capacity ratio k2 (Steps S215, S220) and/or the determination based on diffusion coefficient Ds (Step S225, S230) can be omitted.

Thus the FIG. 12 flowchart allows an amount of lithium deposited or furthermore the negative electrode's capacity ratio to be used to determine whether rechargeable lithium ion battery 10 has a reusable/recyclable negative electrode. Furthermore, the diffusion coefficient can also be used to determine whether the battery has a reusable/recyclable negative electrode.

Figure 13:
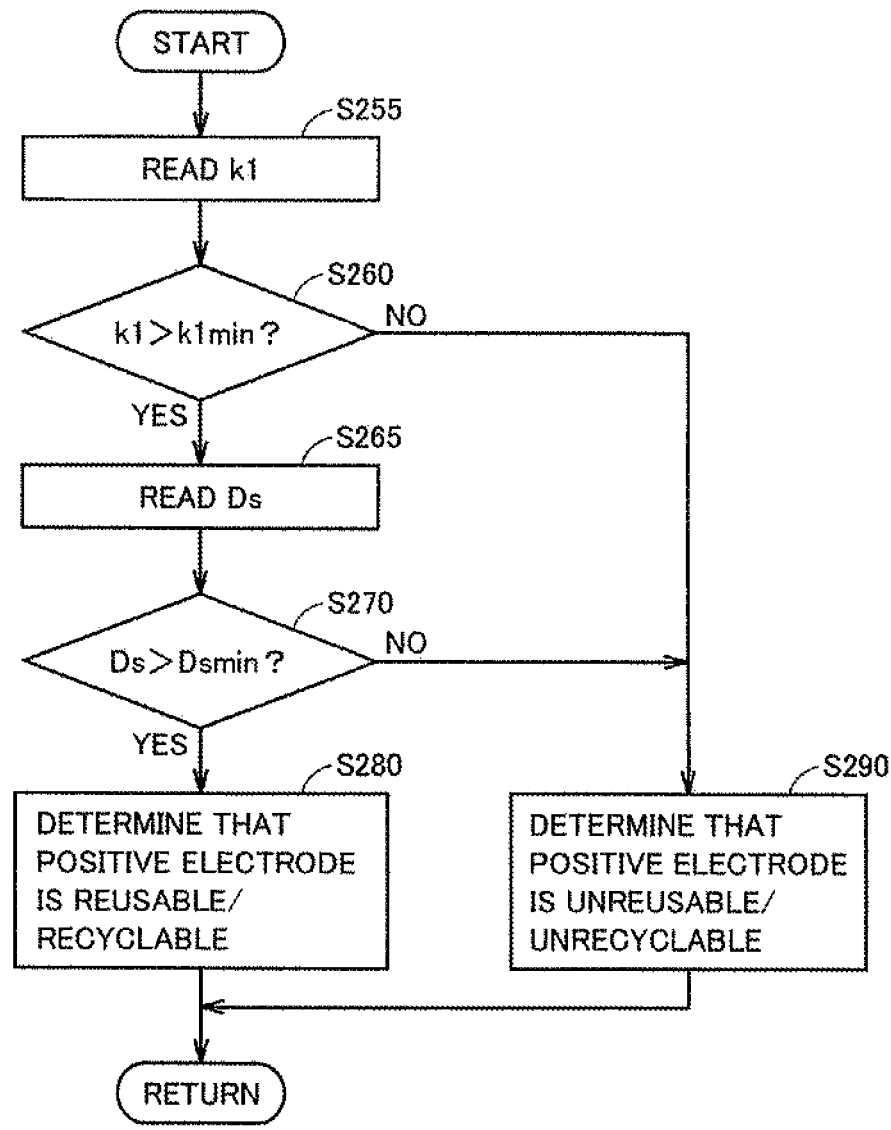
FIG. 13 is a flowchart specifically showing a procedure of a process for determination of reusability/recyclability for a positive electrode of a rechargeable lithium ion battery.

FIG. 13 is a flowchart specifically showing a procedure of a controlling process for determining whether a rechargeable lithium ion battery has a reusable/recyclable positive electrode.

With reference to FIG. 13, MPU 31 at Step S255 reads the positive electrode's capacity ratio k1 obtained at Step S100, and MPU 31 at Step S260 compares the positive electrode's capacity ratio k1 with a determination value k1min. Then, when the positive electrodes capacity ratio k1 is equal to or smaller than determination value k1min (NO at S260), MPU 31 determines that the positive electrode's capacity is decreased beyond a reusable/recyclable level, and MPU 31 proceeds to Step S290.

When the positive electrode's capacity ratio k1 is larger than determination value k1min, (YES at S260) MPU 31 performs determination based on a still another degradation parameter. For example MPU 31 at Step S265 further reads diffusion coefficient Ds and at Step S270 compares diffusion coefficient Ds with determination value Dsmin.

If diffusion coefficient Ds is equal to or smaller than determination value Dsmin and the diffusion resistance has attained a predetermined level (NO at Step 270), MPU 31 proceeds to Step S290 to determine that the positive electrode is unreusable/unrecyclable. On the other hand, if diffusion coefficient Ds is larger than determination value Dsmin and the diffusion resistance has not attained the predetermined level, MPU 31 proceeds to Step S280.

Since each degradation parameter subject to determination satisfies a determination value, MPU 31 at Step S280 determines that the positive electrode is reusable/recyclable. Note that the determination based on diffusion coefficient Ds (Steps S265, S270) may be omitted.

The FIG. 13 flowchart allows the positive electrode's capacity ratio to be used to determine whether rechargeable lithium ion battery 10 has a reusable/recyclable positive electrode. Furthermore, the diffusion coefficient can also be used to determine whether the battery has a reusable/recyclable positive electrode.

In FIG. 12 and FIG. 13, determination values Lmax, k1min, k2min, and Dsmin can each be set to have different values between determination for recyclability and that for reusability. That is, these determination values can each be defined to have a plurality of thresholds to allow a similar process to be performed to determine reusability/recyclability for each threshold. In other words, the FIG. 12 and FIG. 13 controlling process can be used for one or both of determination for recyclability and that for reusability.

Thus the present embodiment allows the determination of degradation of a rechargeable lithium ion battery, based on parameter $\Delta Qs(Li)$ that reflects an amount of lithium deposited, to determine whether the rechargeable lithium ion battery is recyclable and/or reusable. In particular, parameter $\Delta Qs(Li)$ can be calculated without disassembling a cell and conducting a chemical analysis and whether a rechargeable lithium ion battery is reusable can nondestructively be determined appropriately. Further, whether a positive electrode is recyclable and whether a negative electrode is recyclable can be determined individually, and determination for recyclability aiming at material recovery through cell disassembly can thus further be useful.

Figures 14, 15:
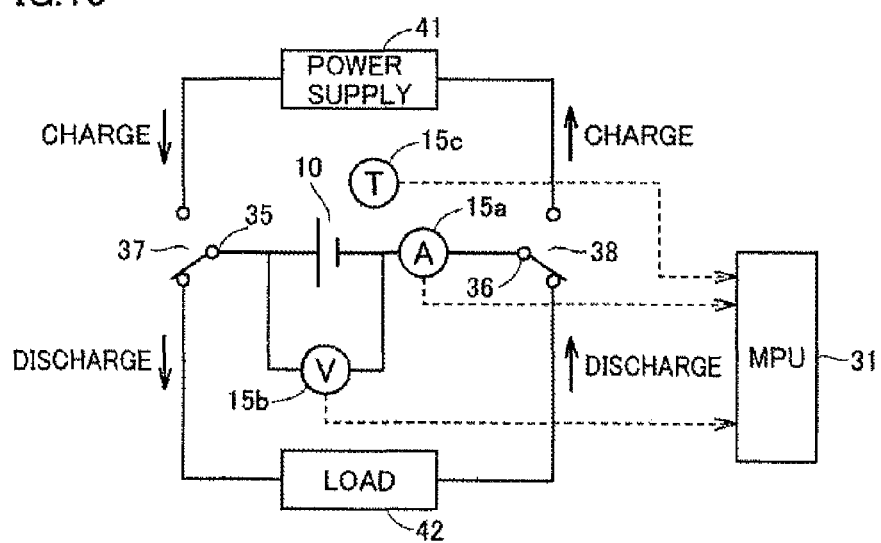
FIG. 14 is a table for illustrating an example of determining reusability in determining degradation of a rechargeable lithium ion battery according to an embodiment of the present invention.
FIG. 15 is a block diagram showing a system for measuring an open circuit voltage characteristic of a rechargeable lithium ion battery off board.

Note that whether a battery can be reused without disassembling cells can be determined, as shown in FIG. 14, in view of that the positive electrode's reusability/recyclability and the negative electrode's reusability/recyclability can individually be determined.

FIG. 14 is a table for illustrating an example in a system for determining degradation of a rechargeable lithium ion battery to determine whether the battery is reusable according to the present embodiment of the present invention.

FIG. 14 shows a case in which for example the determination values shown in FIG. 12 and FIG. 13 are provided to have two thresholds to provide three degradation levels to determine reusability.

For each of positive and negative electrodes, a determination result "C" indicates an unreusable/unrecyclable degradation level, and determination results "B" and "A" indicate reusable/recyclable degradation levels. Furthermore, the determination result "A" indicates less degradation than the determination result "B", and indicates that degradation is not advanced.

With reference to FIG. 14, when at least one of the positive electrode and the negative electrode receives the determination result "C", it is determined that rechargeable lithium ion battery 10 is unreusable (NG). When the positive electrode and the negative electrode both receive the determination result "A" or "B" it is determined that rechargeable lithium ion battery 10 is reusable (OK).

Rechargeable lithium ion battery 10 that is reusable is subdivided by a grade I corresponding to a less degraded level and allowing the battery to be reused for a relatively long period of time and a grade II allowing the battery to be reused for a period of time shorter than grade I.

For example when the positive electrode and the negative electrode both receive the determination result "A" it is determined that the battery is reusable at grade I, whereas when at least one of the electrodes receives determination result "B" it is determined that the battery is reusable at grade II.

Thus the present embodiment allows the determination of degradation of a rechargeable lithium ion battery to be determined such that the positive electrode's reusability/recyclability and the negative electrode's reusability/recyclability can individually be determined to allow more precise determination on reusability/recyclability than conventional.

Second Embodiment

In the first embodiment has generally been described that an open circuit voltage characteristic of rechargeable lithium ion battery 10 subject to determination of degradation is measured on board or off board to obtain degradation parameters, or the positive electrodes capacity ratio k1, the negative electrode's capacity ratio k2, and battery capacity fluctuation amount (or deviated capacity) $\Delta Qs$.

In a second embodiment and its variation will further be described manners of obtaining these degradation parameters on board and off board, respectively.

FIG. 15 is a block diagram indicating a system for measuring the open circuit voltage characteristic of rechargeable lithium ion battery 10 of board.

Rechargeable lithium ion battery 10 has positive and negative electrodes electrically connected to test terminals 35 and 36 shown in FIG. 1 via terminals 11 and 12 shown in and FIG. 1.

As a result, rechargeable lithium ion battery 10 is connected to a power supply 41 electrically charged and discharged off board and a load 42 via switches 37 and 38. Load 42 receives electric power discharged from rechargeable lithium ion battery 10. Furthermore, power supply 41 supplies electric power to electrically charge rechargeable lithium ion battery 10. MPU 31 can control switches 37 and 38 to control electrically discharging and charging rechargeable lithium ion battery 10.

Note that while the FIG. 15 system is configured such that rechargeable lithium ion battery 10 is connected to load 42 and power supply 41 as switches 37 and 38 are switched on/off as controlled, the FIG. 15 configuration is not the only configuration to measure an open circuit voltage characteristic off board. That is, any configuration is applicable that can electrically charge and discharge rechargeable lithium ion battery 10, as intended, to vary its capacity.

If rechargeable lithium ion battery 10 is an in-vehicle battery pack mounted in a hybrid vehicle (HV), a fuel cell vehicle, an electric vehicle (EV), or a similar electrically powered vehicle, an inverter can be used as load 42. The inverter receives direct current electric power from the battery pack and converts it into alternating current electric power, and supplies it to a motor/generator which generates kinetic energy to cause the vehicle to travel. By causing the vehicle to travel, the battery packs available capacity is reduced and subsequently the battery pack is removed from the vehicle and subsequently the FIG. 15 system can be used to measure open circuit voltage of rechargeable lithium ion battery 10 off board.

Current sensor 15a, voltage sensor 15b, and temperature sensor 15c sense the rechargeable lithium ion battery 10 current, voltage and temperature, respectively, and output sensed results to MPU 31. Current sensor 15a, voltage sensor 15b, and temperature sensor 15c configure battery sensor 15 shown in FIG. 1.

Connecting rechargeable lithium ion battery 10 to power supply 41 allows the rechargeable lithium ion battery 10 open circuit voltage OCV to be measured while varying rechargeable lithium ion battery 10 in capacity (SOC). This can provide data indicating how rechargeable lithium ion battery 10 varies in open circuit voltage (as measured) OCV as the battery varies in capacity (i.e., an open circuit voltage curve).

Figure 16:
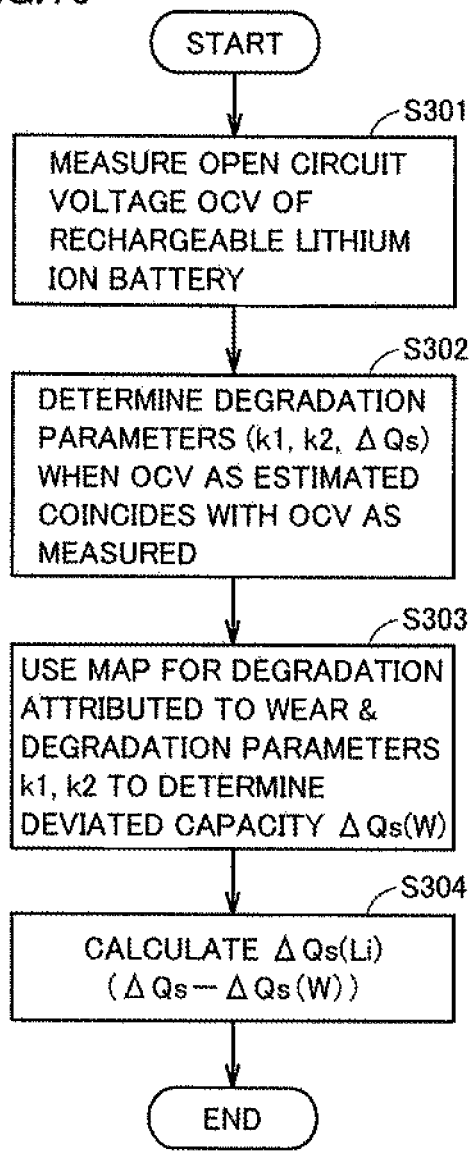
FIG. 16 is a flowchart showing a procedure of a controlling process for obtaining a degradation parameter of a rechargeable lithium ion battery off board.

FIG. 16 is a flowchart showing a controlling process procedure performed by MPU 31 for obtaining a degradation parameter of a rechargeable lithium ion battery off board. FIG. 16 is equivalent to a specific embodiment of Step S100 of FIG. 11 in obtaining a degradation parameter off board.

With reference to FIG. 16, MPU 31 at Step S301 measures open circuit voltage (as measured) OCV of rechargeable lithium ion battery 10 subject to determination of degradation, based on an output of voltage sensor 15b. Specifically, measuring open circuit voltage (as measured) OCV while electrically charging/discharging rechargeable lithium ion battery 10 allows an open circuit voltage curve (as measured) to be obtained.

MPU 31 at Step S302 appropriately modifies three degradation parameters (the positive electrode's capacity ratio k1, the negative electrode's capacity ratio k2, and deviated capacity $\Delta Qs$) and thus determines whether open circuit voltage (as estimated) OCV determined by the three degradation parameters coincide with open circuit voltage (as measured) OCV obtained at Step S301.

Figure 17:
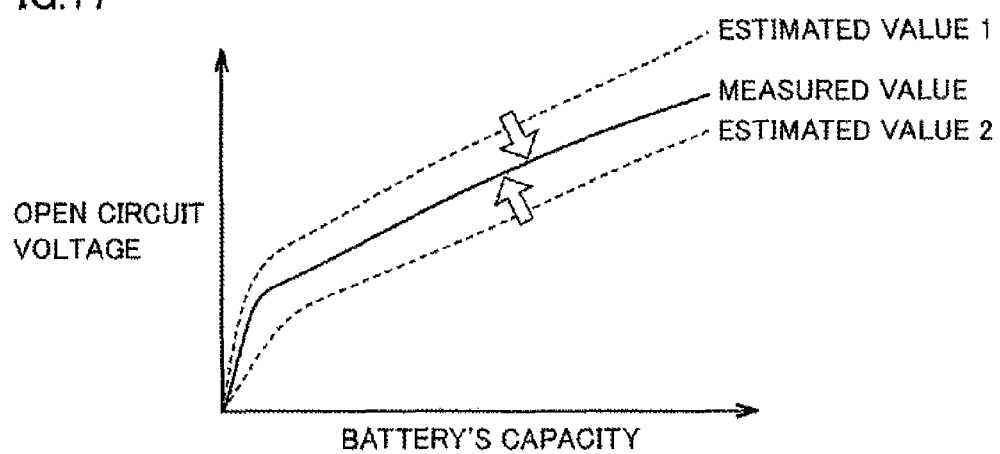
FIG. 17 is a conceptual diagram for describing a process causing an open circuit voltage curve (as estimated) to coincide with an open circuit voltage curve (as measured).

As shown in FIG. 17, specifically, the three degradation parameters are set in any combination and thus used to calculate open circuit voltage (as estimated) OCV. FIG. 17 shows an example of a relationship between open circuit voltage (as estimated) OCV represented by a dotted line and open circuit voltage (as measured) OCV represented by a solid line.

In FIG. 17, when an open circuit voltage curve of an estimated value 1 is obtained, open circuit voltage (as estimated) OCV is higher than open circuit voltage (as measured) OCV, and accordingly, the degradation parameters are re-set to approach the open circuit voltage curve as measured. Similarly, when an open circuit voltage curve of an estimated value 2 is obtained, open circuit voltage (as estimated) OCV is lower than open circuit voltage (as measured) OCV, and accordingly, the degradation parameters are re-set to approach the open circuit voltage curve as measured. Thus, the degradation parameters can repeatedly be re-set to allow open circuit voltage (as estimated) OCV to coincide with open circuit voltage (as measured) OCV.

Again with reference to FIG. 16, MPU 31 at Step S302 determines the degradation parameters when open circuit voltage (as estimated) OCV coincides with open circuit voltage (as measured) OCV. The positive electrode's capacity ratio k1, the negative electrode's capacity ratio k2, and deviated capacity $\Delta Qs$ are thus determined. Note that deviated capacity $\Delta Qs$ determined at Step S302 is deviated capacity $\Delta Qs$ obtained when degradation attributed to deposition of lithium and degradation attributed to wear are both present.

If open circuit voltage (as estimated) OCV does not completely coincide with open circuit voltage (as measured) OCV, setting a range in which they are regarded as coinciding with each other (i.e., a tolerable error) allows whether open circuit voltage (as estimated) OCV and open circuit voltage (as measured) OCV coincide with each other to be determined.

MPU 31 at Step S303 uses the positive and negative electrodes' capacity ratios k1 and k2 determined at Step S302 and the map for degradation attributed to wear (see FIG. 10) to determine deviated capacity $\Delta Qs(W)$. Furthermore, MPU 31 at Step S304 obtains a difference between deviated capacity $\Delta Qs$ obtained at Step S302 and deviated capacity $\Delta Qs(W)$ obtained at Step S303. This calculates deviated capacity $\Delta Qs(Li)$ resulting from degradation attributed to deposition of lithium.

Thus in the second embodiment an open circuit voltage characteristic of rechargeable lithium ion battery 10 subject to determination of degradation can be measured off board to obtain degradation parameters, or the positive electrode's capacity ratio k1, the negative electrodes capacity ratio k2, and deviated capacity $\Delta Qs$. Furthermore, as has also been described in the first embodiment deviated capacity $\Delta Qs$ can be separated into deviated capacity $\Delta Qs(W)$ resulting from degradation attributed to wear and deviated capacity $\Delta Qs(Li)$ resulting from degradation attributed to deposition of lithium to allow deposition of lithium to be quantitatively estimated without disassembling rechargeable lithium ion battery 10 and conducting a chemical analysis.

Second Embodiment in Exemplary Variation

The second embodiment in an exemplary variation provides the process that has been described in the second embodiment (see FIG. 16) on board. For example a process similar to that of the second embodiment is performed by a controller (ECU) controlling electrically charging/discharging a rechargeable lithium ion battery mounted in an electrically powered vehicle. An electrically powered vehicle which can electrically charge an in-vehicle battery (a rechargeable lithium ion battery) from a power supply external to the vehicle, is used. Such a vehicle includes a plug-in hybrid vehicle (PHV) and an EV.

Figure 18:
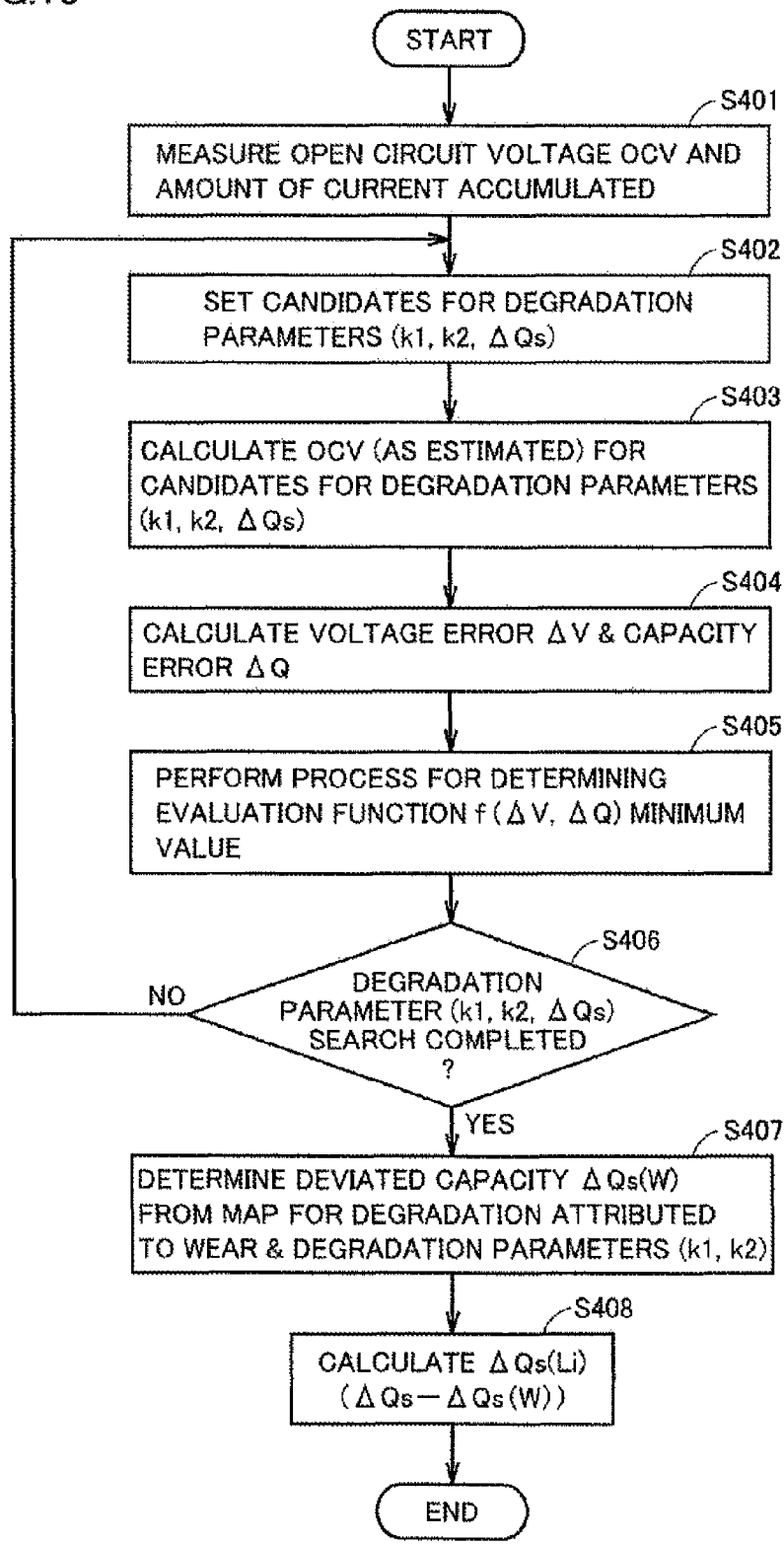
FIG. 18 is a flowchart showing a procedure of a controlling process for obtaining a degradation parameter of a rechargeable lithium ion battery that is mounted in a vehicle on board.

FIG. 18 is a flowchart showing a procedure of a controlling process for obtaining a degradation parameter of a rechargeable lithium ion battery that is mounted in a vehicle on board. The FIG. 18 process is performed by a controller (ECU 20 indicated in FIG. 1 for example) mounted in a vehicle.

FIG. 18 is equivalent to a specific embodiment of Step S100 of FIG. 11 in obtaining degradation parameters on board. That is, in the exemplary variation of the second embodiment, degradation parameter acquisition unit 40 (FIG. 2) has its function partially implemented outside battery checker 30.

ECU 20 at Step S401 measures open circuit voltage (as measured) OCV of rechargeable lithium ion battery 10 and an amount of a current accumulated of the battery, as based on an output of the voltage sensor and that of the current sensor that are included in battery sensor 15. Specifically, when rechargeable lithium ion battery 10 mounted in a vehicle is electrically charged, open circuit voltage (as measured) OCV and an amount of a current accumulated are measured, as appropriate, and a curve can thus be obtained that indicates how the batters open circuit voltage (as pleasured) OCV varies as its capacity varies (i.e., an open circuit voltage curve as a measured value).

ECU 20 at Step S402 sets (or selects) candidates for degradation parameters the positive electrode's capacity ratio k1, the negative electrode's capacity ratio k2, and deviated capacity $\Delta Qs$) for determining open circuit voltage (as estimated) OCV. While the degradation parameters can be set in various methods, preferably, a method is selected for performing an operation process for setting the degradation parameters efficiently.

For example, a degradation parameter may be selected within, a range which is previously determined through an experiment or the like and in which degradation attributed to wear and degradation attributed to deposition of lithium are actually caused. Note that the positive electrode's capacity ratio k1 and the negative electrode's capacity ratio k2 depend solely on degradation attributed to wear, and accordingly, the positive electrode's capacity ratio k1 and the negative electrode's capacity ratio k2 can be varied within a range within which degradation attributed to wear is actually caused. Once the positive electrode's capacity ratio k1 and the negative electrode's capacity ratio k2 have been determined, the map for degradation attributed to wear (FIG. 10) can be used to determine deviated capacity $\Delta Qs(W)$ resulting from degradation attributed to wear. Once deviated capacity $\Delta Qs(W)$ has been determined, what is necessary is simply to vary deviated capacity $\Delta Qs(Li)$.

Then, ECU 20 at Step S403 uses the degradation parameters set at Step S402 to calculate a characteristic indicating how open circuit voltage (as estimated) OCV varies as the capacity varies (i.e., an open circuit voltage curve as an estimated value).

ECU 20 at Step S404 calculates an error between the open circuit voltage curve (as estimated) calculated at Step S403 and the open circuit voltage curve (as measured) obtained at Step S401. This error includes a voltage error and a capacity error.

Figure 19:
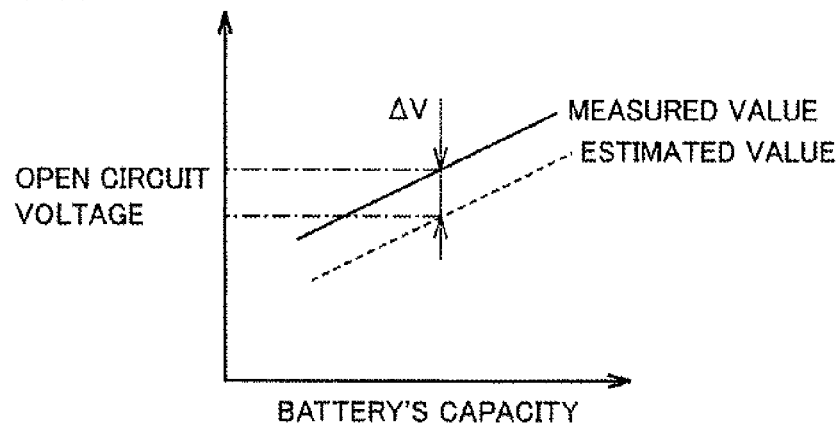
FIG. 19 is a figure representing an error voltage between an open circuit voltage curve (as estimated) and an open circuit voltage curve (as measured).

A voltage error $\Delta V$ (see FIG. 19) can be calculated specifically by comparing the open circuit voltage curve (as estimated) and the open circuit voltage curve (as measured). Voltage error $\Delta V$ may be a voltage error in a specific battery capacity, or may be an average of voltage errors between two open circuit voltage curves.

Furthermore, a capacity error $\Delta Q$ can be obtained for example in a method described hereinafter. Initially, the open circuit voltage curve (as estimated) is used to calculate a capacity Q1 between an open circuit voltage before the battery is electrically charged and an open circuit voltage after the battery is electrically charged. Furthermore, after electrically charging the battery is started before doing so ends, a current is sensed and accumulated in value, and a charged capacity Q2 can be calculated therefrom. By obtaining a difference between capacity Q1 and capacity Q2, an absolute value of capacity error $\Delta Q$ (|Q1−Q2|) can be obtained.

Note that it is difficult to obtain an open circuit voltage curve (as measured) for a hybrid vehicle which is not equipped with a charger by an external power supply. However, when rechargeable lithium ion battery 10 is relaxed, some open circuit voltages located on the open circuit voltage curve (as measured) can be measured. Note that when rechargeable lithium ion battery 10 passes a current or immediately after a current is interrupted or the like, there is a difference in concentration of lithium in the active material and open circuit voltage cannot be measured accurately.

On the other hand, once time has elapsed after rechargeable lithium ion battery 10 was interrupted from electrical conduction, rechargeable lithium ion battery 10 will be relaxed, and accordingly there is no difference in concentration of lithium and open circuit voltage can accurately be measured. Rechargeable lithium ion battery 10 is relaxed for example when a vehicle is stopped beyond a predetermined period of time. Thus, open circuit voltage (as measured) OCV of the rechargeable lithium ion battery for when the battery has a specific capacity can be obtained.

Figure 20:
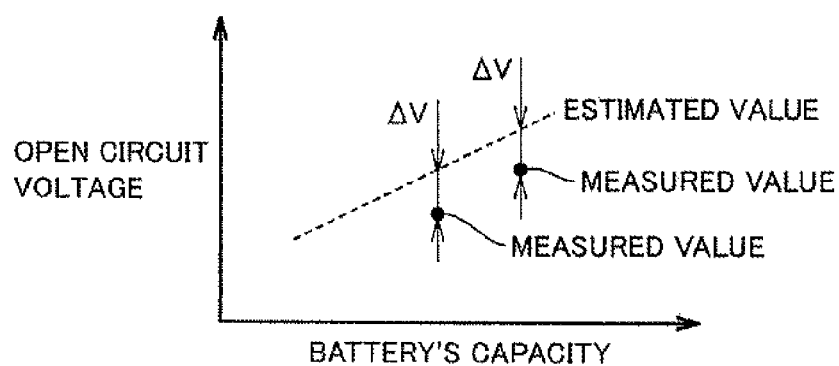
FIG. 20 is a figure showing an error voltage between an open circuit voltage curve (as estimated) and open circuit voltage.

The specific open circuit voltage measured for the specific capacity allows an open circuit voltage (as measured) to be compared with an open circuit voltage curve (as estimated) to obtain voltage error $\Delta V$, as shown in FIG. 20. Furthermore, if a plurality of open circuit voltages (as measured) are measured, capacity error $\Delta Q$ can be obtained as described above. Specifically, an open circuit voltage curve (as estimated) is used to calculate capacity Q1 between open circuit voltages of two points (as measured). Furthermore, measuring a value of an accumulated current when the open circuit voltages (as measured) of the two points are obtained allows the value to be used to calculate capacity Q2. Then, a difference of capacity Q1 and capacity Q2 (|Q1−Q2|) can be calculated to obtain an absolute value of capacity error $\Delta Q$.

ECU 20 at Step S405 calculates an evaluation function f ($\Delta V$, $\Delta Q$) for voltage error $\Delta V$ and capacity error $\Delta Q$ obtained at Step S404. As evaluation function f ($\Delta V$, $\Delta Q$), voltage error $\Delta V$ and capacity error $\Delta Q$ with a weight added thereto can be used.

Furthermore. ECU 20 determines whether evaluation function f ($\Delta V$, $\Delta Q$) calculated from the currently set degradation parameters is smaller than evaluation function f ($\Delta V$, $\Delta Q$) calculated from the immediately previously set degradation parameters. Herein, if the current evaluation function f ($\Delta V$, $\Delta Q$) is smaller than the immediately previous evaluation function f ($\Delta V$, $\Delta Q$), the former is stored to a memory. If the current evaluation function f ($\Delta V$, $\Delta Q$) is larger than the immediately previous evaluation function f ($\Delta V$, $\Delta Q$), the latter will remain stored in the memory.

ECU 20 at Step S406 determines whether each degradation parameter has been varied throughout a search range, and if so, ECU 20 proceeds to Step S407. Otherwise, ECU 20 returns to Step S402.

Thus, Steps S402-S406 are repeated until each degradation parameter has been varied throughout a search range. Then, evaluation function f ($\Delta V$, $\Delta Q$) that serves as a minimum value is determined and an open circuit voltage curve for which this evaluation function (or the minimum value) is obtained can be determined, and the degradation parameters (k1, k2, $\Delta Qs$) defining an open circuit voltage curve (as estimated) can be determined. Determining degradation parameters allowing an evaluation function to indicate a minimum value allows a degraded state (i.e., degradation attributed to wear and degradation attributed to deposition of lithium) to be determined more precisely.

Herein, deviated capacity $\Delta Qs$ that is determined includes deviated capacity $\Delta Qs(W)$ by degradation attributed to wear, and deviated capacity $\Delta Qs(Li)$ by degradation attributed to deposition of lithium. Accordingly, ECU 20 at Step S407 uses degradation parameters determined through Steps S402-S406 (i.e., the positive electrode's capacity ratio k1 and the negative electrode's capacity ratio k2) and the map for degradation attributed to wear (see FIG. 10) to determine deviated capacity $\Delta Qs(W)$ resulting from degradation attributed to wear. Then, ECU 20 at Step S408 calculates a difference between deviated capacity $\Delta Qs$ determined through Steps S402-S406 and deviated capacity $\Delta Qs(W)$ obtained at Step S407 to calculate deviated capacity $\Delta Qs(Li)$ attributed to deposition of lithium.

Thus the second embodiment in the exemplary variation allows a rechargeable lithium ion battery mounted in an electrically powered vehicle to be diagnosed for degradation, as based on an open circuit voltage characteristic, to obtain a positive electrode's capacity ratio k1, a negative electrode's capacity ratio k2, and deviated capacity $\Delta Qs$ on board. In particular, the degradation parameters can be obtained on board based on an open circuit voltage characteristic for both PHV and EV having a function using a power supply external to the vehicle to externally electrically charge an in-vehicle battery, and a hybrid vehicle which is not equipped with the function. The obtained degradation parameters can be used to quantitatively estimate deposition of lithium without disassembling rechargeable lithium ion battery 10 and conducting a chemical analysis.

Thus, the function of degradation parameter acquisition unit 40 indicated in FIG. 2 in obtaining the degradation parameters off board can be implemented by the battery checker 30 MPU 31, whereas that in obtaining the degradation parameters on board can partially be implemented by an ECU mounted in the vehicle (for example, ECU 20 of FIG. 1).

Third Embodiment

In a third embodiment will be described an exemplary variation of a determination process in FIG. 11 at Step S200 (determination unit 60 of FIG. 1), or additional example thereof.

Figure 21:
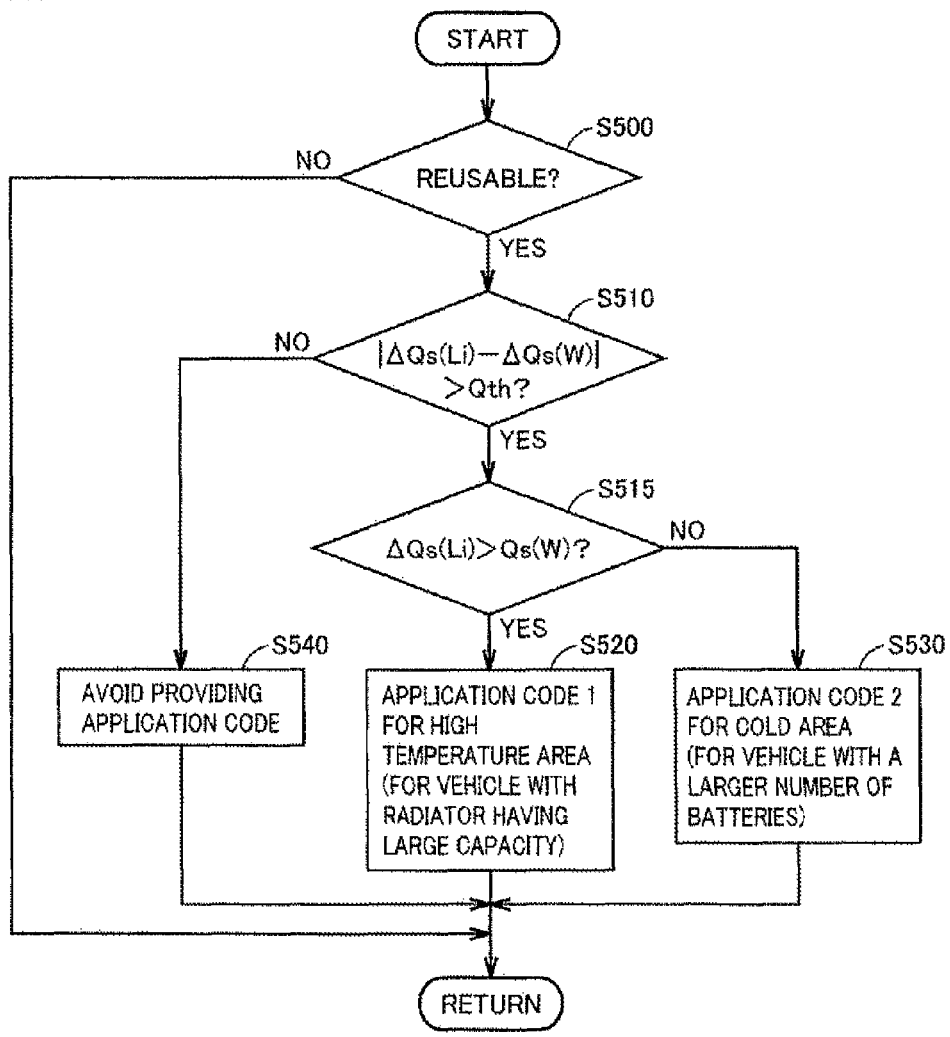
FIG. 21 is a flowchart showing a procedure of a process for illustrating an additional example of determining whether a rechargeable lithium ion battery is reusable in determining degradation of the battery according to a third embodiment of the present invention.

FIG. 21 represents a process procedure for illustrating an additional example of determining whether a rechargeable lithium ion battery is reusable in determining degradation of the battery according to the third embodiment of the present invention. FIG. 21 represents a controlling process that can be additionally performed for the determination process performed in the first embodiment.

With reference to FIG. 21, after MPU 31 determines reusability/recyclability according to FIG. 11 to FIG. 13, MPU 31 at Step S150 confirms whether rechargeable lithium ion battery 10 is reusable. If not (NO at S500), the following process is not performed.

If rechargeable lithium ion battery 10 is reusable (YES at S500), MPU 31 at Step S510 determines whether $\Delta Qs(Li)$ and $\Delta Qs(W)$ have a difference larger than a determination value Qth. That is, MPU 31 at Step S510 determines which one of a deviated capacity resulting from degradation attributed to wear and a deviated capacity resulting from deposition of lithium is a dominant factor of overall deviated capacity $\Delta Qs$ of rechargeable lithium ion battery 10.

Then, when $|\Delta Qs(Li)-\Delta Qs(W)|>Qth$ (YES at S510), MPU 31 at Step S515 determines what relationship $\Delta Qs(Li)$ and $\Delta Qs(W)$ have therebetween in magnitude. For $\Delta Qs(Li)>\Delta Qs(W)$ (YES at S515), MPU 31 proceeds to Step S520 to set an application code at "1". In contrast, for $\Delta Qs(W)>\Delta Qs(Li)$ (NO at S515) MPU 31 proceeds to Step S530 to set the application code at "2". The application code represents a climate condition that is preferable in reusing rechargeable lithium ion battery 10.

Rechargeable lithium ion battery 10 having $\Delta Qs(Li)-\Delta Qs(W)>Qth$ and degraded dominantly by deposition of lithium is given the application code "1" indicating that the battery is suitable for being used at high temperature, since deposited lithium has such a tendency that when it is held at high temperature for a long period of time it is recoverable to lithium that can again contribute to cell reaction. Then, rechargeable lithium ion battery 10 given the application code "1" is mounted for example in a vehicle having a radiator with a capacity set to be larger than normal for a tropical area.

On the other hand, rechargeable lithium ion battery 10 having $\Delta Qs(W)-\Delta Qs(Li)>Qth$ and degraded dominantly through wear is given the application code "2" indicating that the battery is suitable for being used at low temperature, since degradation attributed to wear is easily caused when the battery is used at high temperature, and it is less easily caused when the battery is used at low temperature. Then, rechargeable lithium ion battery 10 given the application code "2" is mounted for example in a vehicle having mounted therein a larger number of accessory batteries than normal for a cold district.

In contrast, $|\Delta Qs(Li)-\Delta Qs(W)|\leq Qth$ (NO at S510) indicates that degradation attributed to wear and degradation attributed deposition of lithium are in balance. Accordingly, MPU 31 proceeds to Step S540 to end the process without providing the application code.

Thus, the FIG. 21 determination of degradation of a rechargeable lithium ion battery (or reusable) allows deviated capacity $\Delta Qs$ of rechargeable lithium ion battery 10 (battery capacity fluctuation amount) to be separated into amount $\Delta Qs(W)$ resulting from degradation attributed to wear and amount $\Delta Qs(Li)$ resulting from deposition of lithium to further provide determination information indicating a climate condition suitable for reuse.

Figure 22:
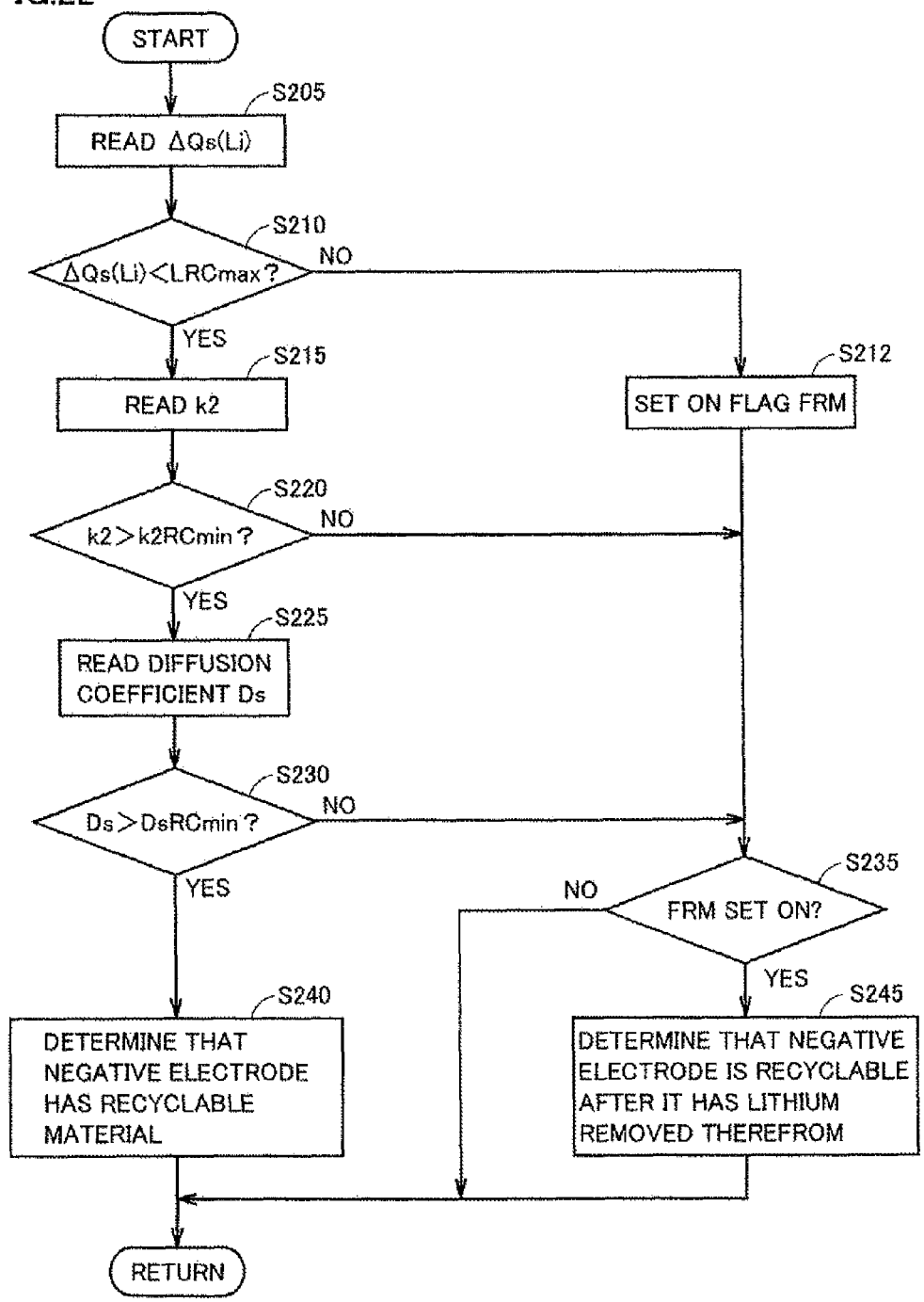
FIG. 22 is a flowchart showing a procedure of a controlling process in determining degradation of a rechargeable lithium ion battery for determining whether the battery has a recyclable negative electrode according to the third embodiment.

FIG. 22 is a flowchart showing a procedure of a controlling process in determining degradation of a rechargeable lithium ion battery to determine whether the battery has a recyclable negative electrode according to the third embodiment.

With reference to FIG. 22, MPU 31 performs steps S205 and S210 similar to FIG. 12, and when $\Delta Qs(Li)$ is equal to or larger than a determination value LRCmax (NO at S210), MPU 31 proceeds to Step S212 to set on a flag FRM.

Furthermore, MPU 31 can perform Steps S215, S220 and/or Steps S225, S230 similarly as done in FIG. 12 to compare the negative electrode's capacity ratio k2 and/or the negative electrode's diffusion coefficient Ds with a determination value to determine recyclability.

That is, the FIG. 22 process relates to determination on reusability/recyclability for a negative electrode, including both reusability and recyclability, that relates to determination for recyclability. Accordingly, Steps S220 and S230 are also performed with determination values k2RCmin and DsRCmin involved in determining recyclability. If the negative electrode's capacity ratio k2 or diffusion coefficient Ds is a determination value or smaller (NO at S220 or S230), MPU 31 skips Step S212.

For YES at Step S230, i.e., when a degradation parameter including deviated capacity $\Delta Qs(Li)$ resulting from deposition of lithium does not have a degradation level having a determination value or larger MPU 31 proceeds to Step S240 and determines that the negative electrode's material is recyclable.

On the other hand, when either deviated capacity $\Delta Qs(Li)$ resulting from deposition of lithium or the negative electrode's capacity ratio k2 and diffusion coefficient Ds is/are degraded beyond a determination value, MPU 31 determines at Step S235 whether flag FRM is set on.

If so (YES at S235), i.e., when deviated capacity $\Delta Qs(W)$ resulting from deposition of lithium is larger than the determination value MPU 31 proceeds to Step S245 and determines that the negative electrode is recyclable after it has lithium removed therefrom. When flag FRM is set off (NO at S235), Step S245 is skipped.

Lithium metal is dissolvable in water or the like, and a lithium removal process to dissolve lithium in a solvent can remove lithium to allow the negative electrode's material to be recycled. Accordingly, rechargeable lithium ion battery 10 degraded by excessive lithium deposition can additionally be subjected to the lithium removal process to provide a possibility that the negative electrode's material may be recycled.

The FIG. 22 determination of degradation of a rechargeable lithium ion battery and determination of whether its negative electrode's material is recyclable, that is additionally provided with a lithium removal process, allows a recyclable battery to be extracted and can thus further add a recyclable subject. Furthermore, the lithium removal process can be performed less frequently and a simpler and less expensive recycling process can be achieved than when how much lithium is deposited is not considered and rechargeable lithium ion batteries to be recycled are all undergo the lithium removal process.

Note that while the second embodiment and its exemplary variation have been described such that rechargeable lithium ion battery 10 subject to determination of degradation is a battery pack mounted in an electrically powered vehicle, the present invention is not limited thereto. That is, a rechargeable lithium ion battery allowing, an open circuit voltage characteristic to be measured therefrom off board and a degradation parameter to be obtained therefrom according to at least the second embodiment can be determined for reusability/recyclability by the determination of degradation that has been described in the first and third embodiments.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

INDUSTRIAL APPLICABILITY

The present invention is applicable to a diagnosis for degradation for determining whether a rechargeable lithium ion battery is reusable/recyclable.

REFERENCE SIGNS LIST

10: rechargeable lithium ion battery (subject to determination of degradation); 11: positive electrode terminal; 12: negative electrode terminal; 15: battery sensor; 15a: current sensor; 15b: voltage sensor; 15c: temperature sensor; 30: battery checker; 31: MPU; 32: memory; 33: communication device; 35, 36: test terminal; 37, 38: switch; 40: degradation parameter acquisition unit; 41: power supply; 42: load; 50: lithium deposition estimation unit; 60: determination unit; Ds: diffusion coefficient; Dsmin, LRCmax, Lmax, Lmax, k1min, k2min, Dsmin, Qth, k1min, k2RCmax, k2min: determination value; FRM: flag; OCV: open circuit voltage; Q1, Q2: capacity; U1, U2: open circuit potential; k1: positive electrode's capacity ratio; k2: negative electrode's capacity ratio; ΔQs: battery capacity fluctuation amount (deviated capacity); ΔQs(Li): deviated capacity (resulting from deposition of lithium); ΔQs(W): deviated capacity (resulting from degradation attributed to wear).

The invention claimed is:

1. A system for determining degradation of a rechargeable lithium ion battery, comprising:
a degradation parameter acquisition unit operative to perform a degradation diagnosis based on an open circuit voltage characteristic of said rechargeable lithium ion battery indicating how said rechargeable lithium ion battery varies in open circuit voltage as said battery varies in capacity to obtain a capacity ratio of a positive electrode of said rechargeable lithium ion battery, a capacity ratio of a negative electrode of said rechargeable lithium ion battery, and a battery capacity fluctuation amount;
a lithium deposition estimation unit operative to apply said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and
a determination unit operative to determine whether said rechargeable lithium ion battery is reusable/recyclable based on at least one of: said capacity ratios respectively of said positive and negative electrodes obtained by said degradation parameter acquisition unit; and said second amount calculated by said lithium deposition estimation unit;
said capacity ratio of said positive electrode being represented by a ratio of a capacity of said positive electrode with said rechargeable lithium ion battery in a degraded state to a capacity of said positive electrode with said rechargeable lithium ion battery in an initial state,
said capacity ratio of said negative electrode being represented by a ratio of a capacity of said negative electrode with said rechargeable lithium ion battery in said degraded state to a capacity of said negative electrode with said rechargeable lithium ion battery in said initial state,
said battery capacity fluctuation amount being indicated by a product of said capacity of said negative electrode in said degraded state and an amount of a deviation of an axis of a composition of said negative electrode relative to an axis of a composition of said positive electrode in said degraded state.

2. The system for determining degradation of a rechargeable lithium ion battery according to claim 1, wherein said determination unit determines whether said negative electrode of said rechargeable lithium ion battery is reusable/recyclable based at least on said second amount calculated by said lithium deposition estimation unit, and said determination unit determines whether said positive electrode of said rechargeable lithium ion battery is reusable/recyclable based at least on said capacity ratio of said positive electrode obtained by said degradation parameter acquisition unit.

3. The system for determining degradation of a rechargeable lithium ion battery according to claim 2, wherein said determination unit compares said second amount obtained by said lithium deposition estimation unit with a predetermined determination value to determine whether said negative electrode of said rechargeable lithium ion battery has a recyclable material.

4. The system for determining degradation of a rechargeable lithium ion battery according to claim 2, wherein:
said determination unit determines whether said rechargeable lithium ion battery is reusable/recyclable based on comparison between at least one of said capacity ratio of said positive electrode, said capacity ratio of said negative electrode and said second amount, and a predetermined determination value;
said determination value includes a first determination value for determining whether said rechargeable lithium ion battery is reusable, and a second determination value for determining whether said rechargeable lithium ion battery has an electrode with a recyclable material; and
said determination unit determines that said rechargeable lithium ion battery is reusable when it is determined that said positive electrode and said negative electrode are both reusable/recyclable in accordance with a determination of reusability/recyclability with said first determination value used, and said determination unit determines whether said positive electrode and said negative electrode are recyclable individually in accordance with said determination of reusability/recyclability with said second determination value used.

5. The system for determining degradation of a rechargeable lithium ion battery according to claim 1, wherein said determination unit generates information based on a relationship in magnitude between said first and second amounts calculated by said lithium deposition estimation unit to indicate a climate condition suitable for reusing said rechargeable lithium ion battery.

6. The system for determining degradation of a rechargeable lithium ion battery according to claim 1, wherein said determination unit generates information based on said second amount calculated by said lithium deposition estimation unit to indicate whether it is necessary to perform a process of removing deposited lithium in recycling a material of said negative electrode of said rechargeable lithium ion battery.

7. The system for determining degradation of a rechargeable lithium ion battery according to claim 1, wherein said degradation parameter acquisition unit includes:

a measurement unit operative to measure said open circuit voltage characteristic by sensing a voltage and a current output by said rechargeable lithium ion battery as said rechargeable lithium ion battery is electrically charged and discharged and accordingly varies in capacity; and a parameter searching unit operative to determine said open circuit voltage characteristic that allows a minimum voltage error and a minimum capacity error for said open circuit voltage characteristic that is measured by said measurement unit while said capacity ratio of said positive electrode, said capacity ratio of said negative electrode, and said battery capacity fluctuation amount are varied to search for said capacity ratio of said positive electrode of said rechargeable lithium ion battery, said capacity ratio of said negative electrode, and said battery capacity fluctuation amount of said rechargeable lithium ion battery.

8. The system for determining degradation of a rechargeable lithium ion battery according to claim 7, wherein:

said rechargeable lithium ion battery is mounted in an electrically powered vehicle configured to be externally electrically chargeable by a power supply external to said vehicle; and said measurement unit measures said open circuit voltage characteristic when said vehicle is externally electrically charged.

9. The system for determining degradation of a rechargeable lithium ion battery according to claim 7, wherein:

said rechargeable lithium ion battery is mounted in an electrically powered vehicle including a hybrid vehicle; and said measurement unit measures said open circuit voltage characteristic by using: said open circuit voltage sensed as based on said voltage output when said rechargeable lithium ion battery is in a relaxed state; and how said battery varies in capacity, as sensed as based on an integral of said current output during each said relaxed state.

10. The system for determining degradation of a rechargeable lithium ion battery according to claim 7, wherein:

said measurement unit and said parameter searching unit are configured by a control unit mounted in said electrically powered vehicle for managing and controlling electrically charging and discharging said rechargeable lithium ion battery; and said degradation parameter acquisition unit communicates with said control unit to obtain said capacity ratio of said positive electrode, said capacity ratio of said negative electrode, and said battery capacity fluctuation amount.

11. A method for determining degradation of a rechargeable lithium ion battery, comprising the steps of:

performing a degradation diagnosis based on an open circuit voltage characteristic of said rechargeable lithium ion battery indicating how said rechargeable lithium ion battery varies in open circuit voltage as said battery varies in capacity to obtain a capacity ratio of a positive electrode of said rechargeable lithium ion battery, a capacity ratio of a negative electrode of said rechargeable lithium ion battery, and a battery capacity fluctuation amount;

applying said capacity ratios respectively of said positive and negative electrodes that are obtained to a previously obtained correspondence between said capacity ratios respectively of said positive and negative electrodes and a first amount of said battery capacity fluctuation amount to separate said battery capacity fluctuation amount that is obtained into said first amount and a second amount of said battery capacity fluctuation amount, said first amount corresponding to degradation attributed to wear, said second amount corresponding to degradation attributed to deposition of lithium; and determining whether said rechargeable lithium ion battery is reusable/recyclable based on at least one of: said capacity ratios respectively of said positive and negative electrodes obtained; and said second amount obtained in the step of applying;

said capacity ratio of said positive electrode being represented by a ratio of a capacity of said positive electrode with said rechargeable lithium ion battery in a degraded state to a capacity of said positive electrode with said rechargeable lithium ion battery in an initial state, said capacity ratio of said negative electrode being represented by a ratio of a capacity of said negative electrode with said rechargeable lithium ion battery in said degraded state to a capacity of said negative electrode with said rechargeable lithium ion battery in said initial state, said battery capacity fluctuation amount being indicated by a product of said capacity of said negative electrode in said degraded state and an amount of a deviation of an axis of a composition of said negative electrode relative to an axis of a composition of said positive electrode in said degraded state.

12. The method for determining degradation of a rechargeable lithium ion battery according to claim 11, wherein the step of determining includes the steps of:

determining whether said negative electrode of said rechargeable lithium ion battery is reusable/recyclable based at least on said second amount obtained in the step of applying; and determining whether said positive electrode of said rechargeable lithium ion battery is reusable/recyclable based at least on said capacity ratio of said positive electrode obtained.

13. The method for determining degradation of a rechargeable lithium ion battery according to claim 12, wherein the step of determining includes the step of comparing said second amount obtained in the step of applying with a predetermined determination value to determine whether said negative electrode of said rechargeable lithium ion battery has a recyclable material.

14. The method for determining degradation of a rechargeable lithium ion battery according to claim 12, wherein:

the step of determining includes determining whether said rechargeable lithium ion battery is reusable/recyclable based on a comparison between at least one of said capacity ratio of said positive electrode, said capacity ratio of said negative electrode and said second amount, and a predetermined determination value;

said determination value includes a first determination value for determining whether said rechargeable lithium ion battery is reusable, and a second determination value for determining whether said rechargeable lithium ion battery has an electrode with a recyclable material; and the step of determining includes determining that said rechargeable lithium ion battery is reusable when it is determined that said positive electrode and said negative electrode are both reusable/recyclable in accordance with a determination of reusability/recyclability with said first determination value used, and also determining whether said positive electrode and said negative electrode are recyclable individually in accordance with said determination of reusability/recyclability with said second determination value used.

15. The method for determining degradation of a rechargeable lithium ion battery according to claim 11, wherein the step of determining includes the step of generating information based on a relationship in magnitude between said first and second amounts obtained in the step of applying to indicate a climate condition suitable for reusing said rechargeable lithium ion battery.

16. The method for determining degradation of a rechargeable lithium ion battery according to claim 11, wherein the step of determining includes the step of generating information based on said second amount obtained in the step of applying to indicate whether it is necessary to perform a process of removing deposited lithium in recycling a material of said negative electrode of said rechargeable lithium ion battery.

17. The method for determining degradation of a rechargeable lithium ion battery according to claim 11, wherein the step of performing includes the steps of:
  measuring said open circuit voltage characteristic by sensing a voltage and a current output by said rechargeable lithium ion battery as said rechargeable lithium ion battery is electrically charged and discharged and accordingly varies in capacity; and
  determining said open circuit voltage characteristic that allows a minimum voltage error and a minimum capacity error for said open circuit voltage characteristic that is measured while said capacity ratio of said positive electrode, said capacity ratio of said negative electrode, and said battery capacity fluctuation amount are varied to search for said capacity ratio of said positive electrode, said capacity ratio of said negative electrode, and said battery capacity fluctuation amount of said rechargeable lithium ion battery.

18. The method for determining degradation of a rechargeable lithium ion battery according to claim 17, wherein:
  said rechargeable lithium ion battery is mounted in an electrically powered vehicle configured to be externally electrically chargeable by a power supply external to said vehicle; and
  the step of measuring includes measuring said open circuit voltage characteristic when said vehicle is externally electrically charged.

19. The method for determining degradation of a rechargeable lithium ion battery according to claim 17, wherein:
  said rechargeable lithium ion battery is mounted in an electrically powered vehicle including a hybrid vehicle; and
  the step of measuring includes measuring said open circuit voltage characteristic by using: said open circuit voltage sensed as based on said voltage output when said rechargeable lithium ion battery is in a relaxed state; and how said battery varies in capacity, as sensed as based on an integral of said current output during each said relaxed state.

20. The method for determining degradation of a rechargeable lithium ion battery according to claim 17, wherein:
  the step of measuring and the step of determining said open circuit voltage characteristic are performed by a control unit mounted in said electrically powered vehicle for managing and controlling electrically charging and discharging said rechargeable lithium ion battery; and
  the step of performing includes communicating with said control unit to obtain said capacity ratio of said positive electrode, said capacity ratio of said negative electrode, and said battery capacity fluctuation amount.

* * * * *